United States Patent
Heo et al.

(10) Patent No.: US 9,570,471 B2
(45) Date of Patent: Feb. 14, 2017

(54) ORGANIC LIGHT EMITTING DISPLAY DEVICE AND METHOD OF MANUFACTURING THE SAME

(71) Applicant: LG DISPLAY CO., LTD., Seoul (KR)

(72) Inventors: JoonYoung Heo, Seoul (KR); HeeSuk Pang, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 76 days.

(21) Appl. No.: 14/818,003

(22) Filed: Aug. 4, 2015

(65) Prior Publication Data

US 2016/0043341 A1    Feb. 11, 2016

(30) Foreign Application Priority Data

Aug. 5, 2014  (KR) .................. 10-2014-0100273
Apr. 27, 2015  (KR) .................. 10-2015-0058894

(51) Int. Cl.
| H01L 27/12 | (2006.01) |
| H01L 51/52 | (2006.01) |
| H01L 27/32 | (2006.01) |

(52) U.S. Cl.
CPC ....... *H01L 27/1225* (2013.01); *H01L 27/3246* (2013.01); *H01L 27/3279* (2013.01); *H01L 51/5228* (2013.01); H01L 51/5234 (2013.01); H01L 2227/323 (2013.01)

(58) Field of Classification Search
None
See application file for complete search history.

(56) References Cited

U.S. PATENT DOCUMENTS

| 6,005,344 | A  | * | 12/1999 | Fleming | H05B 33/22 313/498 |
| 7,772,763 | B2 | * | 8/2010 | Bae | H01L 27/3246 313/500 |
| 8,087,965 | B2 | * | 1/2012 | Bae | H01L 27/3246 313/500 |
| 8,395,569 | B2 | * | 3/2013 | Min | H01L 27/3253 257/88 |
| 2005/0140303 | A1 | * | 6/2005 | Lee | H01L 27/3246 315/169.3 |
| 2006/0119259 | A1 | * | 6/2006 | Bae | H01L 27/3246 313/506 |
| 2007/0284595 | A1 | * | 12/2007 | Choi | H01L 27/3246 257/88 |

(Continued)

*Primary Examiner* — Lex Malsawma
(74) *Attorney, Agent, or Firm* — Birch, Stewart, Kolasch & Birch, LLP

(57) ABSTRACT

Provided is an organic light emitting display device including: a substrate; a first anode and a second anode formed on the substrate; a first auxiliary electrode formed between the first anode and the second anode; a first organic light emitting layer and a second organic light emitting layer; a first bank including an undercut formed on an upper part of a first edge of the first auxiliary electrode; a second bank including an undercut formed on an upper part of a second edge of the first auxiliary electrode; a second auxiliary electrode disposed between the undercut of the first bank and the first auxiliary electrode; a third auxiliary electrode disposed between the undercut of the second bank and the first auxiliary electrode; a first cathode electrically connected with the second auxiliary electrode; and a second cathode electrically connected with the third auxiliary electrode.

20 Claims, 21 Drawing Sheets

(56) References Cited

U.S. PATENT DOCUMENTS

| | | | | |
|---|---|---|---|---|
| 2008/0143255 A1* | 6/2008 | Lee | ............... | H01L 27/3246 313/504 |
| 2009/0256477 A1* | 10/2009 | Chung | ............ | H01L 27/3246 313/505 |
| 2010/0279444 A1* | 11/2010 | Bae | ............... | H01L 27/3253 438/29 |

* cited by examiner

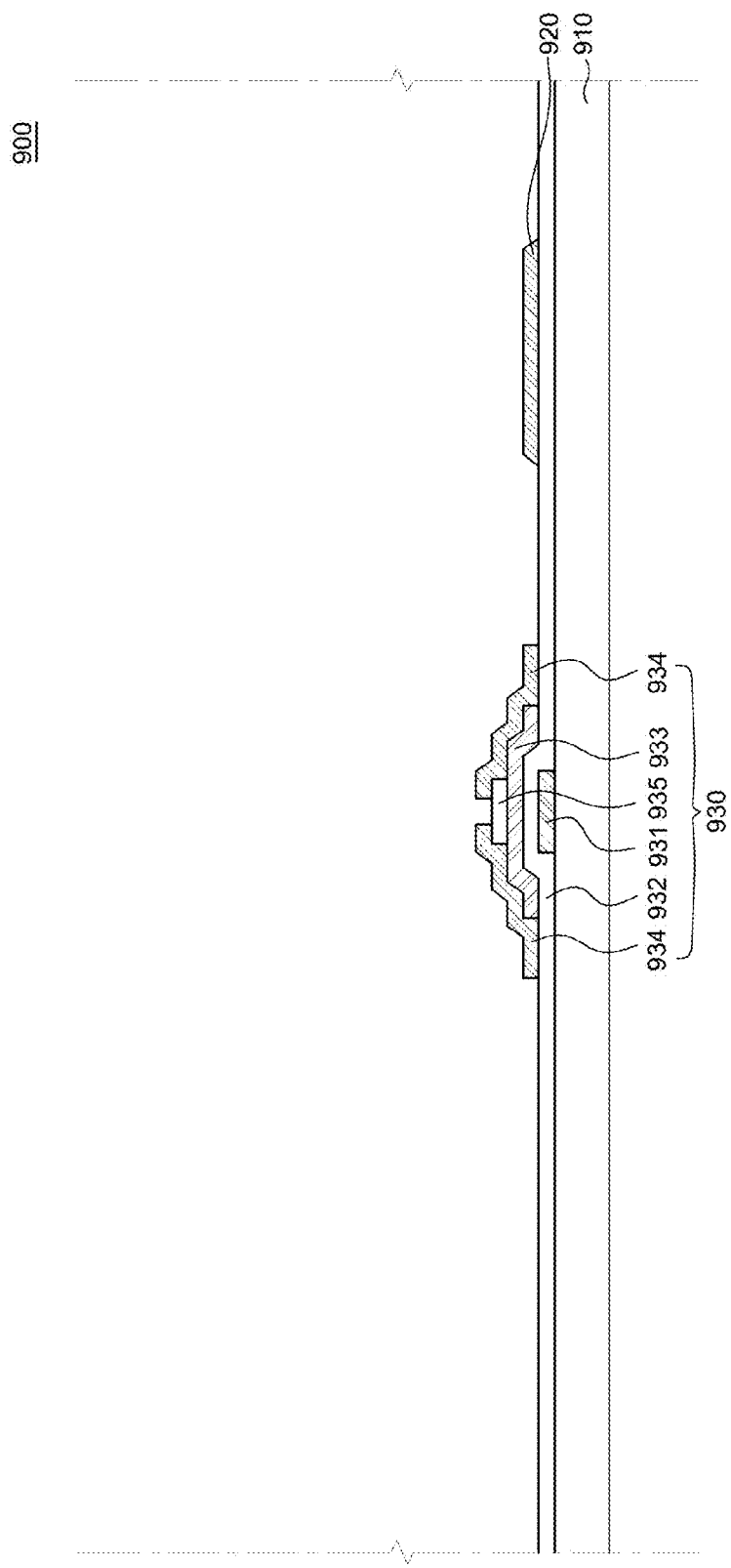

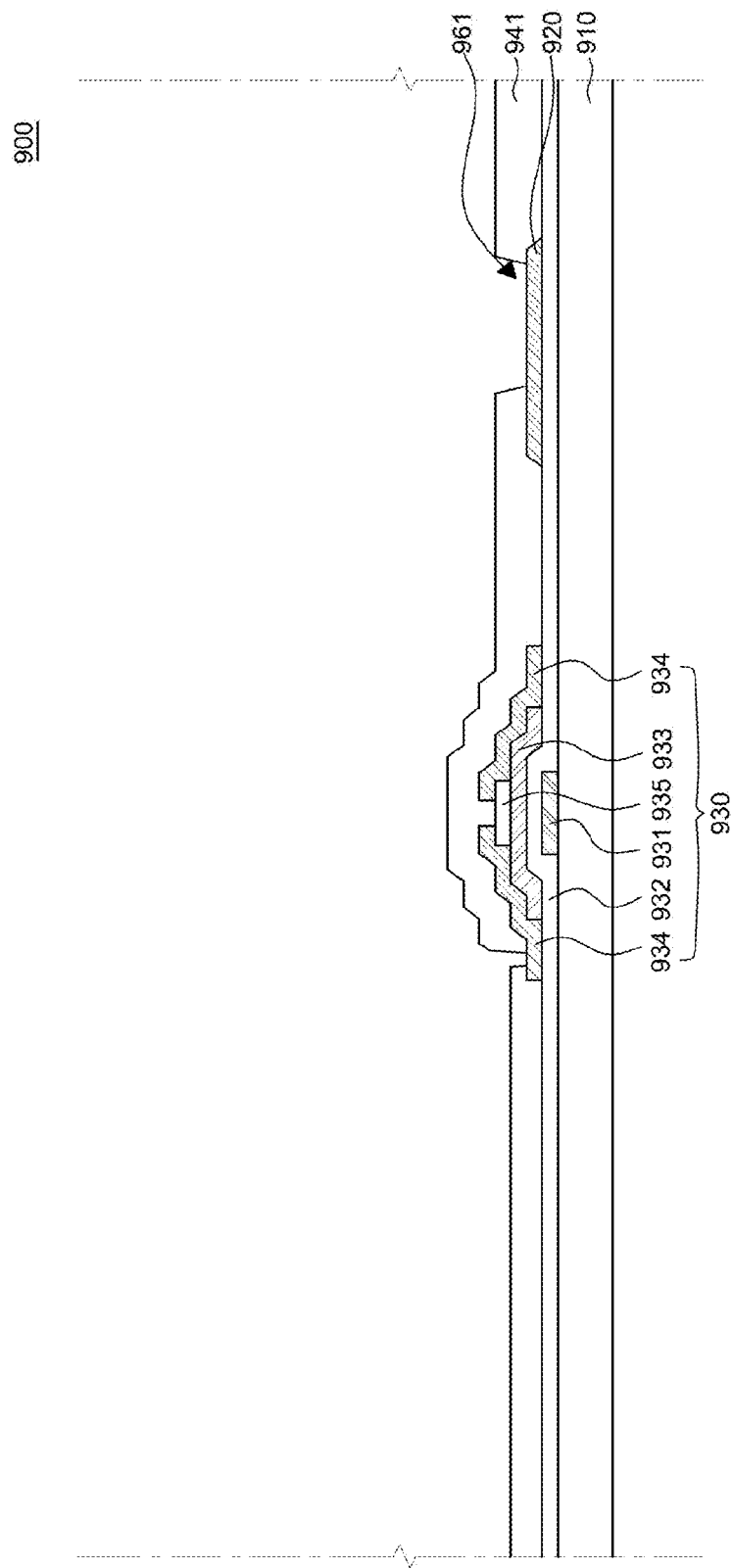

ORGANIC LIGHT EMITTING DISPLAY DEVICE AND METHOD OF MANUFACTURING THE SAME

CROSS-REFERENCE TO RELATED APPLICATIONS

This application claims the priority of Patent Application No. 10-2014-0100273 filed on Aug. 5, 2014 and Patent Application No. 10-2015-0058894 filed on Apr. 27, 2015, in the Korean Intellectual Property Office. The disclosures of all these applications are incorporated herein by reference.

BACKGROUND OF THE INVENTION

Field of the Invention

The present disclosure relates to an organic light emitting display device and a method of manufacturing the same, and more particularly, to an organic light emitting display device and a method of manufacturing the organic light emitting display device capable of minimizing a voltage drop in a cathode and also securing a high opening ratio.

Description of the Related Art

An organic light emitting display device (OLED) is a self-light emitting display device that does not need a separate light source unlike a liquid crystal display device. Thus, the organic light emitting display device can be manufactured into a lightweight and thin form. Further, the organic light emitting display device is advantageous in terms of power consumption since it is driven with a low voltage. Also, the organic light emitting display device has excellent color expression ability, a high response speed, a wide viewing angle, and a high contrast ratio (CR). Therefore, the organic light emitting display device has been researched as a next-generation display device.

In the case of a top-emission organic light emitting display device, a transparent or semi-transmissive electrode is used as a cathode in order to upwardly emit light emitted from an organic light emitting layer. When a transparent or semi-transmissive electrode is used as a cathode, the cathode is formed to have a small thickness in order to improve transmittance. A reduction in thickness of the cathode causes an increase in electrical resistance of the cathode electrode. Thus, in the case of a large-area organic light emitting display device, as a distance from a voltage supply pad unit is increased, a voltage drop is further increased, which may cause a problem in non-uniformity in luminance of the organic light emitting display device.

In order to minimize a voltage drop, a method of using a separate auxiliary electrode has been used. FIG. 1 is a schematic cross-sectional view of an organic light emitting display device including an auxiliary electrode according to the related art.

Referring to FIG. 1, an organic light emitting display device 100 according to the related art includes a flattening layer 140, a first anode 150, a second anode 152, an auxiliary electrode 154, a first organic light emitting layer 160, a second organic light emitting layer 162, an organic material layer 164, a first bank 170, a second bank 172, a partition wall 174, a first cathode 190, a second cathode 192, and a conductor layer 194.

Herein, the first anode 150, the second anode 152, and the auxiliary electrode 154 are formed of the same material in concurrent processes; the first organic light emitting layer 160, the second organic light emitting layer 162, and the organic material layer 164 are formed of the same material in concurrent processes; and the first cathode 190, the second cathode 192, and the conductor 194 are also formed of the same material in concurrent processes.

In the organic light emitting display device 100 illustrated in FIG. 1, the auxiliary electrode 154 electrically connected with the first cathode 190 and the second cathode 192 minimizes a voltage drop and thus improves the non-uniformity in luminance of the organic light emitting display device 100.

However, in the organic light emitting display device 100 illustrated in FIG. 1, it is necessary to dispose the partition wall 174 for insulating the first organic light emitting layer 160 from the second organic light emitting layer 162 on the auxiliary electrode 154. Thus, it is necessary to secure a predetermined distance w1 for disposing the partition wall 174 between the first bank 170 and the second bank 172.

The predetermined distance w1 between the first bank 170 and the second bank 172 needs to be secured but it does not have an area for light emission. Therefore, if the auxiliary electrode 154 and the partition wall 174 are formed in an organic light emitting display device having the same area as the organic light emitting display device 100 illustrated in FIG. 1, an emission region is reduced and an opening ratio of the organic light emitting display device is decreased.

Accordingly, there has been a continuous demand for new technology capable of suppressing a voltage drop and also minimizing a decrease in an opening ratio of an organic light emitting display device.

SUMMARY

The inventors of the present disclosure recognized the problems occurring when manufacturing an organic light emitting display device of the related art including an auxiliary electrode as described above. They invented an organic light emitting display device having a new structure which is capable of suppressing a voltage drop in a cathode and also minimizing a decrease in an opening ratio of the organic light emitting display device.

An object to be achieved by the present disclosure is to provide an organic light emitting display device and a method of manufacturing the same, which is capable of minimizing a voltage drop caused by a cathode in order to maintain uniformity in luminance of the entire display.

Another object to be achieved by the present disclosure is to provide an organic light emitting display device and a method of manufacturing the same that is capable of solving a problem of decrease in an opening ratio caused by disposing an auxiliary electrode between banks.

Yet another object to be achieved by the present disclosure is to provide an organic light emitting display device and a method of manufacturing the same that is capable of connecting an auxiliary electrode and a cathode without a partition wall in order to equalize the luminance of entire display.

Still another object to be achieved by the present disclosure is to provide an organic light emitting display device and a method of manufacturing the same that is advantageous in providing a high resolution and a large area by disposing a contact hole. A contact hole includes an undercut in a flattening layer on an auxiliary electrode to induce a discontinuous section of an organic light emitting layer and expose the auxiliary electrode. Further, an organic light emitting display device is advantageous in connecting the exposed auxiliary electrode with the cathode.

Still another object to be achieved by the present disclosure is to provide an organic light emitting display device and a method of manufacturing the same that is capable of improving the reliability in life of an organic light emitting element. It is achieved by disposing an outgas reducing layer on an inner surface of a contact hole in a flattening layer to block a gas which may be introduced into an organic light emitting layer from the flattening layer.

The objects of the present disclosure are not limited to the aforementioned objects, and other objects, which are not mentioned above, will be apparent to a person having ordinary skill in the art from the following description.

According to an aspect of the present disclosure, there is provided an organic light emitting display device including: a substrate; a first anode and a second anode formed on the substrate; a first auxiliary electrode formed between the first anode and the second anode; a first organic light emitting layer and a second organic light emitting layer respectively formed on the first anode and the second anode; a first bank formed to cover an edge of the first anode and including an undercut formed on an upper part of a first edge of the first auxiliary electrode; a second bank formed to cover an edge of the second anode and including an undercut formed on an upper part of a second edge of the first auxiliary electrode; a second auxiliary electrode disposed between the undercut of the first bank and the first auxiliary electrode; a third auxiliary electrode disposed between the undercut of the second bank and the first auxiliary electrode; a first cathode formed on the first organic light emitting layer and the first bank and electrically connected with the second auxiliary electrode; and a second cathode formed on the second organic light emitting layer and the second bank and electrically connected with the third auxiliary electrode. In the organic light emitting display device according to an aspect of the present disclosure, it is possible to realize a high-resolution display and also minimize a voltage drop in a cathode.

According to another aspect of the present disclosure, there is provided an organic light emitting display device including: a substrate; a thin film transistor disposed on the substrate; a fourth auxiliary electrode formed of the same material as at least one of electrodes constituting the thin film transistor; a flattening layer formed to cover the thin film transistor and the fourth auxiliary electrode; and an organic light emitting element including an anode disposed on the flattening layer, an organic light emitting layer, and a cathode, and the cathode is electrically connected with the fourth auxiliary electrode through a contact hole in the flattening layer so as to have a uniform electrical resistance, and the contact hole includes an undercut configured to electrically connect the cathode with the fourth auxiliary electrode and an outgas reducing layer capable of minimizing a gas generated from the flattening layer. In the organic light emitting display device according to another aspect of the present disclosure, it is possible to improve the life reliability of the organic light emitting element by disposing the outgas reducing layer on the contact hole.

According to yet another aspect of the present disclosure, there is provided a method of manufacturing an organic light emitting display device, including: forming a first auxiliary electrode between a first anode and a second anode while forming the first anode and the second anode on a substrate; forming a sacrificing layer on the first auxiliary electrode; forming a first bank to cover an edge of the first anode and an edge of the sacrificing layer and a second bank to cover an edge of the second anode and an edge of the sacrificing layer; forming a second auxiliary electrode between the first bank and the first auxiliary electrode and a third auxiliary electrode between the second bank and the first auxiliary electrode by etching the sacrificing layer with an etchant; forming a first organic light emitting layer and a second organic light emitting layer respectively on the first anode and the second anode; and forming a first cathode on the first organic light emitting layer and the first bank so as to be electrically connected with the second auxiliary electrode and a second cathode on the second organic light emitting layer and the second bank so as to be electrically connected with the third auxiliary electrode. In the method of manufacturing an organic light emitting display device according to yet another aspect of the present disclosure, it is possible to readily form an undercut of each of the first bank and the second bank, and the second auxiliary electrode and the third auxiliary electrode by the simple processes for forming and etching the sacrificing layer.

According to still another aspect of the present disclosure, there is provided a method of manufacturing an organic light emitting display device, including: forming a thin film transistor and a fourth auxiliary electrode on a substrate; forming a thin film transistor passivation film on the thin film transistor and the fourth auxiliary electrode; exposing the fourth auxiliary electrode by forming a first contact hole in the thin film transistor passivation film; forming a flattening film on the thin film transistor passivation film; exposing a part of the fourth auxiliary electrode and the thin film transistor passivation film by forming a second contact hole in the flattening film; forming a first anode connected with the thin film transistor on the flattening film; forming an outgas reducing layer on the second contact hole; etching the thin film transistor passivation film exposed through the second contact hole; forming a first organic light emitting layer on the first anode; and forming a first cathode on the first organic light emitting layer. In the method of manufacturing an organic light emitting display device according to still another aspect of the present disclosure, it is possible to improve the uniformity in luminance of the organic light emitting display device by providing a connection structure using the contact hole in the flattening layer for electrically connecting an auxiliary electrode and a cathode so as to equalize a current in the cathode.

Details of other exemplary embodiments will be included in the detailed description of the disclosure and the accompanying drawings.

According to the present disclosure, it is possible to minimize a voltage drop in a cathode and also improve the uniformity in luminance of an organic light emitting display device by disposing auxiliary electrodes between banks and between anodes.

According to the present disclosure, it is possible to realize a high-resolution organic light emitting display device by insulating organic light emitting layers with undercuts of banks without using a partition wall.

According to the present disclosure, it is possible to improve the uniformity in luminance of an organic light emitting display device by providing a connection structure using a contact hole in a flattening layer for electrically connecting an auxiliary electrode and a cathode so as to equalize a current in the cathode.

According to the present disclosure, it is possible to improve the life reliability of an organic light emitting element by disposing an outgas reducing layer on a contact hole.

The effects of the present disclosure are not limited to the aforementioned effects, and other effects, which are not mentioned above, will be apparent to a person having ordinary skill in the art from the following description.

BRIEF DESCRIPTION OF THE DRAWINGS

The above and other aspects, features and other advantages of the present disclosure will be more clearly understood from the following detailed description taken in conjunction with the accompanying drawings, in which:

FIG. 9a to FIG. 9f are schematic cross-sectional views provided for describing a method of manufacturing an organic light emitting display device capable of maintaining uniform luminance by connecting a cathode of an organic light emitting element with a fourth auxiliary electrode according to an exemplary embodiment of the present disclosure.

DETAILED DESCRIPTION OF THE PREFERRED EMBODIMENT

Figure 1:
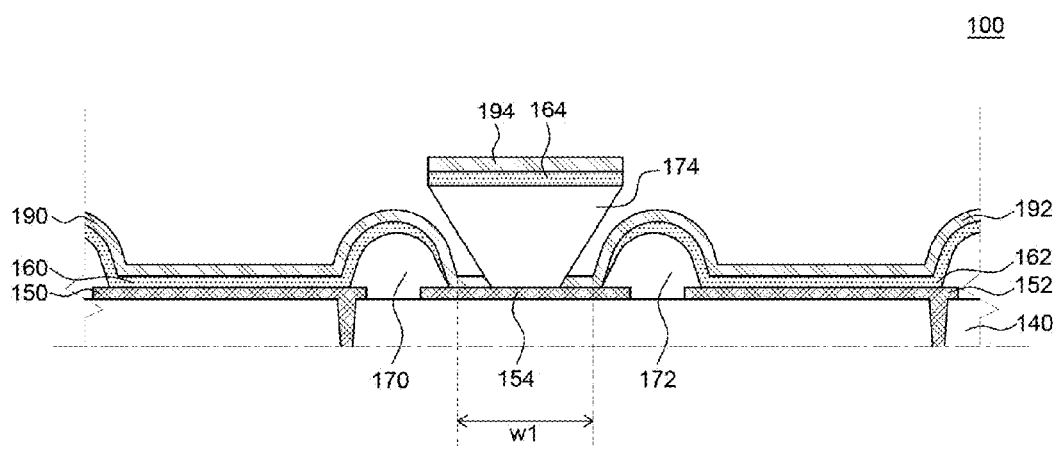
FIG. 1 is a schematic cross-sectional view of an organic light emitting display device including an auxiliary electrode according to the related art.

Advantages and features of the present disclosure, and methods for accomplishing the same will be more clearly understood from exemplary embodiments described below with reference to the accompanying drawings. However, the present disclosure is not limited to the following exemplary embodiments but may be implemented in various different forms. The exemplary embodiments are provided only to complete disclosure of the present disclosure and to fully provide a person having ordinary skill in the art to which the present disclosure pertains with the category of the disclosure, and the present disclosure will be defined by the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the present specification. Further, in the following description, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly" is not used.

When an element or layer is referred to as being "on" another element or layer, it may be directly on the other element or layer, or intervening elements or layers may be present.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Throughout the whole specification, the same reference numerals denote the same elements.

Since size and thickness of each component illustrated in the drawings are represented for convenience in explanation, the present disclosure is not necessarily limited to the illustrated size and thickness of each component.

The features of various embodiments of the present disclosure can be partially or entirely bonded to or combined with each other and can be interlocked and operated in technically various ways as can be fully understood by a person having ordinary skill in the art, and the embodiments can be carried out independently of or in association with each other.

Hereinafter, various exemplary embodiments of the present disclosure will be described in detail with reference to the accompanying drawings.

Figure 2:
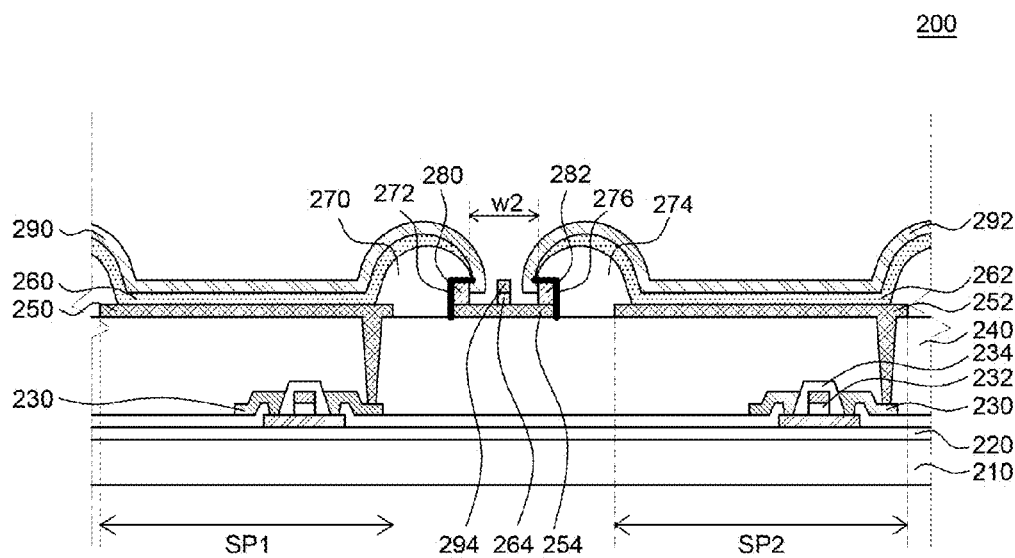
FIG. 2 is a schematic plan view of an organic light emitting display device according to an exemplary embodiment of the present disclosure.

FIG. 2 is a schematic plan view of an organic light emitting display device according to an exemplary embodiment of the present disclosure.

Referring to FIG. 2, an organic light emitting display device 200 includes a substrate 210, a buffer layer 220, a thin film transistor 230, a gate insulating layer 232, an interlayer insulating layer 234, a flattening layer 240, a first anode 250, a second anode 252, a first auxiliary electrode 254, a first organic light emitting layer 260, a second organic light emitting layer 262, an organic material layer 264, a first bank 270, a second bank 274, a second auxiliary electrode 280, a third auxiliary electrode 282, a first cathode 290, a second cathode 292, and a conductor layer 294.

The substrate 210 is configured to support various elements of the organic light emitting display device 200. The substrate 210 may be formed of a material having transparency and flexibility. For example, the substrate 210 may be a glass substrate or a substrate formed of a polyimide-based flexible material.

The substrate 210 includes a first sub-pixel region SP1 and a second sub-pixel region SP2 as regions for displaying a color. Each of the first sub-pixel region SP1 and the second sub-pixel region SP2 emits a different color light, and specifically, emits any one of red, green, and blue lights.

The buffer layer 220 is formed on the substrate 210. The buffer layer 220 suppresses infiltration of water or impurities through the substrate 210 and flattens an upper part of the substrate 210. However, the buffer layer 220 is not an essential element. Whether or not to form the buffer layer 220 is determined on the basis of a kind of the substrate 210 or a kind of the thin film transistor 230 used in the organic light emitting display device 200. Further, the buffer layer 220 may be formed of a transparent material.

The thin film transistor 230 is connected with the first anode 250 and the second anode 252 so as to drive the organic light emitting display device 200. The thin film transistor 230 includes an active layer formed on the buffer layer 220, a gate electrode formed on the gate insulating layer 232, and a source electrode and a drain electrode formed on the interlayer insulating layer 234.

The flattening layer 240 is formed on the thin film transistor 230. The overcoating layer 240 is configured to flatten an upper part of the substrate 210 and serves as a flattening layer. The overcoating layer 240 includes a contact hole for electrically connecting the source electrode of the thin film transistor 230 with the first anode 250 and the second anode 252.

The thin film transistor 230 may be an oxide thin film transistor using an oxide semiconductor or a thin film transistor including polysilicon, but may not be limited thereto.

Further, although FIG. 2 illustrates that the thin film transistor 230 has a coplanar structure, a thin film transistor having an inverted staggered structure may also be used.

The first anode 250 and the second anode 252 are formed on the flattening layer 240. The first anode 250 and the second anode 252 are configured to apply a voltage to the first organic light emitting layer 260 and the second organic light emitting layer 262, respectively. As illustrated in FIG. 2, the first anode 250 and the second anode 252 are formed to be separated for each sub-pixel region. To be specific, the first anode 250 is disposed in the first sub-pixel region SP1 and the second anode 252 is disposed in the second sub-pixel region SP2.

Each of the first anode 250 and the second anode 252 may be formed of a transparent conductive material having a high work function and a reflective plate. Herein, the transparent conductive material may include indium tin oxide (ITO), indium zinc oxide (IZO), and indium tin zinc oxide (ITZO). For convenience in illustration, FIG. 2 illustrates each of the first anode 250 and the second anode 252 as a single layer.

The first auxiliary electrode 254 is formed between the first anode 250 and the second anode 252 and on the flattening layer 240. The first auxiliary electrode 254 is configured to compensate a voltage drop in the first cathode 290 and the second cathode 292.

The first auxiliary electrode 254 may be formed in the same process as the first anode 250 and the second anode 252 at the same time. Therefore, the first auxiliary electrode 254 may be formed of the same material as the first anode 250 and the second anode 252 and may be formed to have the same thickness as the first anode 250 and the second anode 252.

The first auxiliary electrode 254 includes a first edge and a second edge. The first edge of the first auxiliary electrode 254 is an edge portion adjacent to the first anode 250, and the second edge of the first auxiliary electrode 254 is an edge portion adjacent to the second anode 252. The first edge and the second edge of the first auxiliary electrode 254 are disposed to face each other.

The first organic light emitting layer 260 and the second organic light emitting layer 262 are formed on the first anode 250 and the second anode 252, respectively. As illustrated in FIG. 2, the first organic light emitting layer 260 and the second organic light emitting layer 262 are formed to be separated for each sub-pixel region. To be specific, the first organic light emitting layer 260 is disposed in the first sub-pixel region SP1 and the second organic light emitting layer 262 is disposed in the second sub-pixel region SP2. The first organic light emitting layer 260 and the second organic light emitting layer 262 are configured to be applied with a voltage from the first anode 250 and the first cathode 290, and the second anode 252 and the second cathode 292, respectively, so as to emit lights. The first organic light emitting layer 260 may be formed of the same material as the second organic light emitting layer 262.

The organic material layer 264 is formed on a central portion of the first auxiliary electrode 254. As illustrated in FIG. 2, the organic material layer 264 is formed to be separated from the first organic light emitting layer 260 and the second organic light emitting layer 262. The organic material layer 264 may be formed in the same process as the first organic light emitting layer 260 and the second organic light emitting layer 262 at the same time. Therefore, the organic material layer 264 may be formed of the same material as the first organic light emitting layer 260 and the second organic light emitting layer 262 and may be formed to have the same thickness as the first organic light emitting layer 260 and the second organic light emitting layer 262.

The first bank 270 is formed on an edge of the first anode 250 and the first edge of the first auxiliary electrode 254, and the second bank 274 is formed on an edge of second anode 252 and the second edge of the first auxiliary electrode 254. As illustrated in FIG. 2, the first bank 270 is formed to cover the first anode 250 and the second bank 274 is formed to cover the second anode 252. Each of the first bank 270 and the second bank 274 may be formed of any one of transparent organic insulating materials such as polyimide, photo acryl, and benzocyclobutene (BCE), or may be formed of a black material such as black resin.

The first bank 270 includes an undercut 272 formed on an upper part of the first edge of the first auxiliary electrode 254. The second bank 274 includes an undercut 276 formed on an upper part of the second edge of the first auxiliary electrode 254.

In the present specification, an undercut refers to a recessed portion formed along a boundary of a bank, and also refers to a portion including one side that is in contact with the second auxiliary electrode 280 or the third auxiliary electrode 282 and the first auxiliary electrode 254. Referring to FIG. 2, the undercut 272 of the first bank 270 includes one side that is in contact with the second auxiliary electrode 280 and the first auxiliary electrode 254. Further, the undercut 276 of the second bank 274 includes one side that is in contact with the third auxiliary electrode 282 and the first auxiliary electrode 254. Further, each of the undercut 272 of the first bank 270 and the undercut 276 of the second bank 274 may include the other side which faces the first auxiliary electrode 254 and that is in contact with the second auxiliary electrode 280 or the third auxiliary electrode 282. Referring to FIG. 2, the undercut 272 of the first bank 270 includes the other side which is in contact with the second auxiliary electrode 280 and faces the first auxiliary electrode 254. Further, the undercut 276 of the second bank 274 includes the other side which is in contact with the third auxiliary electrode 282 and faces the first auxiliary electrode 254.

A cross section of the undercut 272 of the first bank 270 may be horizontally symmetric in shape with a cross section of the undercut 276 of the second bank 274. For example, as illustrated in FIG. 2, the cross section of the undercut 276 of the second bank 274 may have a ]-shape and the cross section of the undercut 272 of the first bank 270 may have a ⌈-shape horizontally symmetric with the ]-shape. In some exemplary embodiments, the cross section of the undercut 272 of the first bank 270 and the undercut 276 of the second bank 274 may have curved shapes that are horizontally symmetric with each other.

The second auxiliary electrode 280 is disposed between the undercut 272 of the first bank 270 and the first auxiliary electrode 254. The third auxiliary electrode 282 is disposed between the undercut 276 of the second bank 274 and the first auxiliary electrode 254. The second auxiliary electrode 280 and the third auxiliary electrode 282 are also configured to compensate a voltage drop in the first cathode 290 and the second cathode 292.

As illustrated in FIG. 2, the second auxiliary electrode 280 is disposed between the undercut 272 of the first bank 270 and the first auxiliary electrode 254, and, thus, it is completely overlapped with the first bank 270. In other words, the second auxiliary electrode 280 does not protrude from the first bank 270 in a direction toward the second anode 252. Likewise, the third auxiliary electrode 282 is disposed between the undercut 276 of the second bank 274 and the first auxiliary electrode 254, and, thus, it is completely overlapped with the second bank 274.

The second auxiliary electrode 280 may be formed of the same material as the third auxiliary electrode 282. For example, all of the second auxiliary electrode 280 and the third auxiliary electrode 282 may be formed of any one of molybdenum (Mo), aluminum (Al), chromium (Cr), gold (Au), titanium (Ti), nickel (Ni), neodymium (Nd), and copper (Cu), or an alloy thereof.

If the second auxiliary electrode 280 is formed of the same material as the third auxiliary electrode 282, the second auxiliary electrode 280 and the third auxiliary electrode 282 may be formed of a material different in etching selectivity from the first auxiliary electrode 254. In other words, the second auxiliary electrode 280 and the third auxiliary electrode 282 may be formed of a material which can be etched with a specific etchant that does not etch the first auxiliary electrode 254.

Each of the second auxiliary electrode 280 and the third auxiliary electrode 282 may be formed by laminating different kinds of metals. For example, each of the second auxiliary electrode 280 and the third auxiliary electrode 282 may be formed by laminating copper (Cu) on a molybdenum alloy (MoTi). In this case, an interfacial adhesion between each of the second auxiliary electrode 280 and the third auxiliary electrode 282 and the first auxiliary electrode 254 may be improved.

Each of the second auxiliary electrode 280 and the third auxiliary electrode 282 may have a greater thickness than the organic material layer 264. Therefore, it is possible to suppress a space between the first bank 270 and the second bank 274 from being blocked by the organic material layer 264. Also, the first cathode 290 and the second cathode 292 to be formed later can be electrically connected with the second auxiliary electrode 280 and the third auxiliary electrode 282, respectively.

Each of the second auxiliary electrode 280 and the third auxiliary electrode 282 may have a thickness of 3000 to 6000 Å, but is not necessarily limited thereto.

The first cathode 290 is formed on the first organic light emitting layer 260 and the first bank 270, and the second cathode 292 is formed on the second organic light emitting layer 262 and the second bank 274. As illustrated in FIG. 2, the first cathode 290 and the second cathode 292 are formed to be separated from each other. To be specific, the first cathode 290 is formed to correspond to the first sub-pixel region SP1 and the second cathode 292 is formed to correspond to the second sub-pixel region SP2. The first cathode 290 and the second cathode 292 are configured to apply a voltage to the first organic light emitting layer 260 and the second organic light emitting layer 262, respectively.

The first cathode 290 is in contact with the second auxiliary electrode 280, and the second cathode 292 is in contact with the third auxiliary electrode 282. Therefore, the first cathode 290 and the second cathode 292 are electrically connected with the second auxiliary electrode 280 and the third auxiliary electrode 282, respectively. Also, the first cathode 290 and the second cathode 292 are electrically connected with the first auxiliary electrode 254 that is in contact with the second auxiliary electrode 280 and the third auxiliary electrode 282. A voltage drop in each of the first cathode 290 and the second cathode 292 can be sufficiently improved by the first auxiliary electrode 254, the second auxiliary electrode 280, and the third auxiliary electrode 282.

The first cathode 290 may be formed of the same material as the second cathode 292. Further, all of the first cathode 290 and the second cathode 292 may be formed of a material having a higher step coverage than a material of the first organic light emitting layer 260 and the second organic light emitting layer 262. For example, all of the first cathode 290 and the second cathode 292 may be formed of a transparent conductive material such as indium tin oxide (ITO), indium zinc oxide (IZO), and indium tin zinc oxide (ITZO). Since the first cathode 290 and the second cathode 292 are formed of a material having a higher step coverage than a material of the first organic light emitting layer 260 and the second organic light emitting layer 262, the first organic light emitting layer 260 and the second organic light emitting layer 262 are not brought into contact with the second auxiliary electrode 280 and the third auxiliary electrode 282. Further, the first cathode 290 and the second cathode 292 are brought into contact with the second auxiliary electrode 280 and the third auxiliary electrode 282.

Meanwhile, the first cathode 290 and the second cathode 292 may not be entirely formed of a transparent conductive material, but may be formed by laminating a metal having small thickness and a transparent conductive material. In this case, the transparent conductive material has a higher step coverage than the metal. Thus, the first cathode 290 and the second cathode 292 can be electrically connected with the second auxiliary electrode 280 and the third auxiliary electrode 282, respectively, with ease.

The conductor layer 294 is formed on the organic material layer 264. AS illustrated in FIG. 2, the conductor layer 294 is formed to be separated from the first cathode 290 and the second cathode 292. The conductor layer 294 may be formed in the same process as the first cathode 290 and the second cathode 292 at the same time. Therefore, the conductor layer 294 may be formed of the same material as the first cathode 290 and the second cathode 292 and may be formed to have the same thickness as the first cathode 290 and the second cathode 292.

In an organic light emitting display device including an auxiliary electrode according to the related art, it is necessary to form a partition wall for insulating organic light emitting layers on the auxiliary electrode and between a first bank and a second bank. Therefore, it is necessary to secure a space of, for example, about 20 μm which does not emit light but is provided to dispose the partition wall between the first bank and the second bank. Accordingly, an opening ratio of the organic light emitting display device is decreased.

In the organic light emitting display device 200 according to an exemplary embodiment of the present disclosure, the organic material of the organic light emitting layers 260 and 262 has a lower step coverage than the material of the first cathode 290 and the second cathode 292. Accordingly, the organic light emitting layers 260 and 262 are insulated from each other by the undercut 272 of the first bank 270 and the undercut 276 of the second bank 274 instead of a partition wall. Therefore, it is not necessary to secure a space for disposing a partition wall between the first bank 270 and the second bank 274. Thus, it is possible to remarkably reduce a distance w2 between the first bank 270 and the second bank 274 to, for example, 3 to 10 μm. Accordingly, it is possible to achieve an improved opening ratio as compared with the organic light emitting display device including an auxiliary electrode according to the related art.

Meanwhile, although not illustrated in FIG. 2, each of the first cathode 290 and the second cathode 292 may be formed to be in contact with the first auxiliary electrode 254 and thus electrically connected with the first auxiliary electrode 254.

Figure 3:
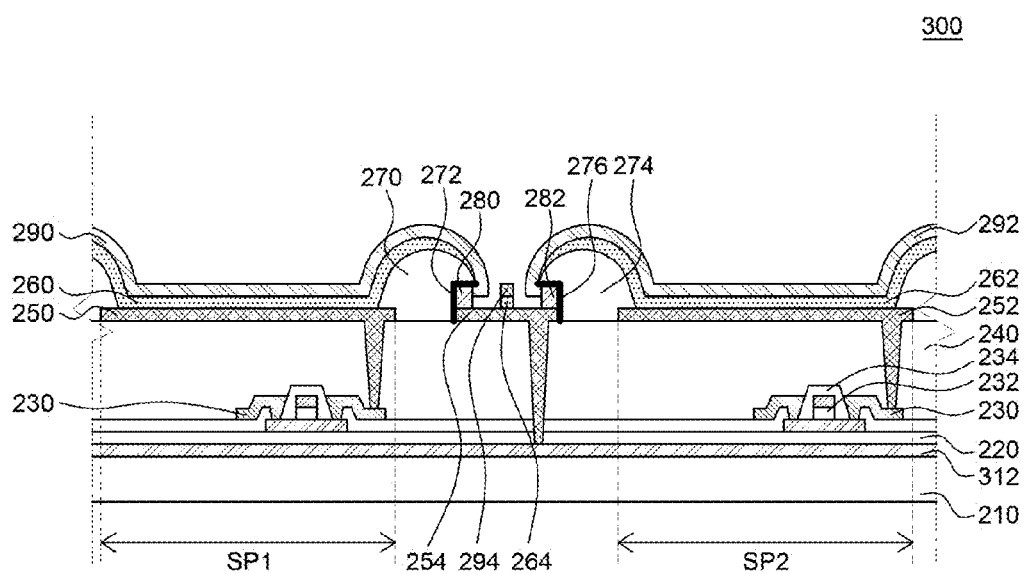
FIG. 3 is a schematic cross-sectional view of an organic light emitting display device according to another exemplary embodiment of the present disclosure.

FIG. 3 is a schematic cross-sectional view of an organic light emitting display device according to another exemplary embodiment of the present disclosure. An organic light emitting display device 300 illustrated in FIG. 3 is the same as the organic light emitting display device 200 illustrated in FIG. 2 except that an active layer is formed of an oxide semiconductor, a light-blocking metal layer 312 is formed between the buffer layer 220 and the substrate 210, and the light-blocking metal layer 312 is electrically connected with the first auxiliary electrode 254. Therefore, redundant explanation thereof will be omitted.

Since the active layer is formed of an oxide semiconductor, the light-blocking metal layer 312 is formed between the buffer layer 220 and the substrate 210. As illustrated in FIG. 3, the light-blocking metal layer 312 may be formed on the entire surface of the substrate 210. The light-blocking metal layer 312 is basically configured to suppress light incident into the active layer and a resultant change in property of the active layer. The light-blocking metal layer 312 may be formed of any one of molybdenum (Mo), aluminum (Al), chromium (Cr), gold (Au), titanium (Ti), nickel (Ni), neodymium (Nd), and copper (Cu), or an alloy thereof.

Referring to FIG. 3, the light-blocking metal layer 312 is electrically connected with the first auxiliary electrode 254. In addition to the first auxiliary electrode 254, the light-blocking metal layer 312 can minimize a voltage drop in the first cathode 290 and the second cathode 292. Thickness and width of the light-blocking metal layer 312 may be determined in various ranges so as to sufficiently improve a voltage drop in the first cathode 290 and the second cathode 292.

In the organic light emitting display device 300 according to another exemplary embodiment of the present disclosure, the light-blocking metal layer 312 disposed between the buffer layer 220 and the substrate 210 is used as another auxiliary electrode together with the first auxiliary electrode 254. Thus, it is possible to further minimize a voltage drop in the first cathode 290 and the second cathode 292.

Figure 4:
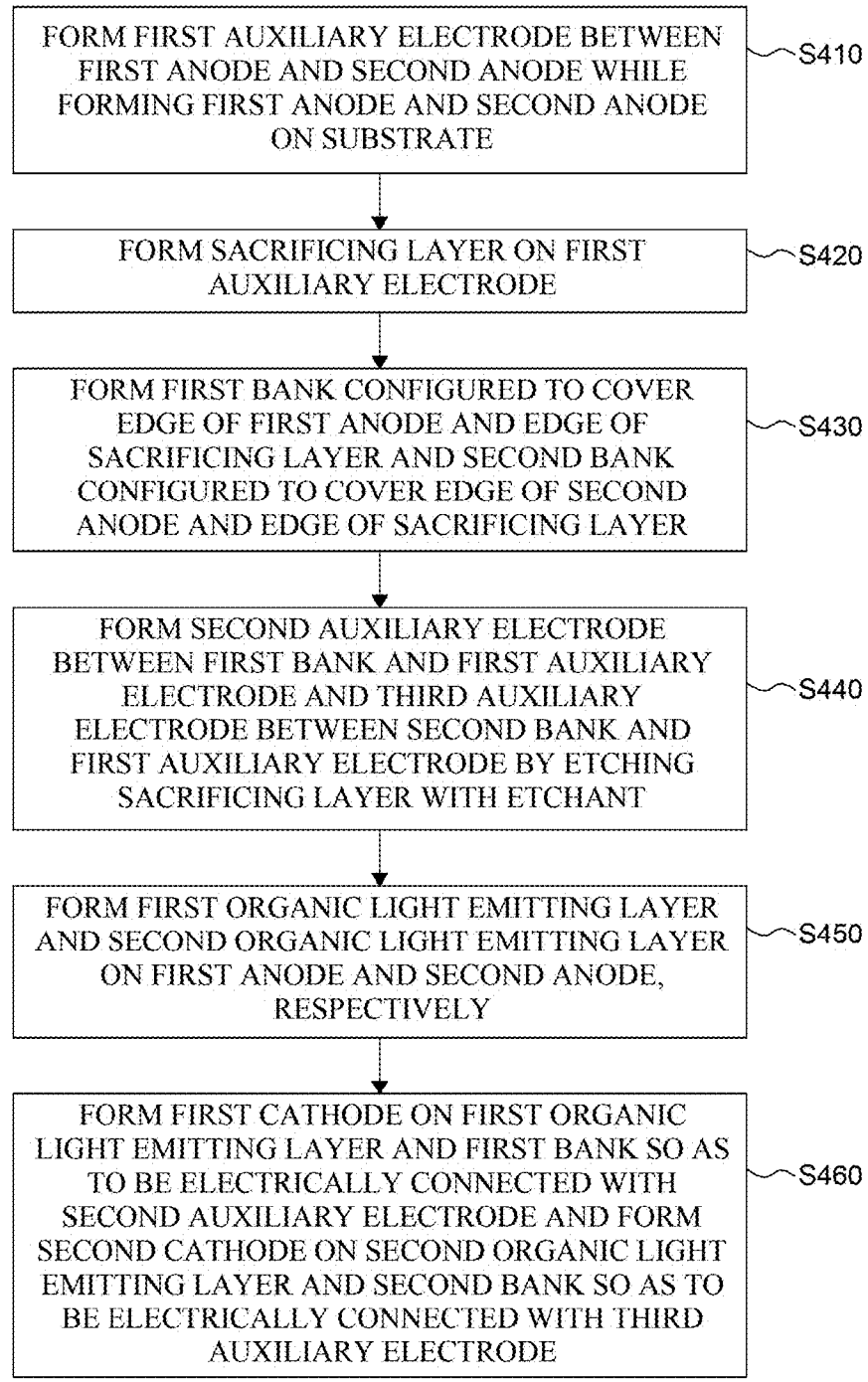
FIG. 4 is a flowchart provided for describing a method of manufacturing an organic light emitting display device according to an exemplary embodiment of the present disclosure.

FIG. 4 is a flowchart provided for describing a method of manufacturing an organic light emitting display device according to an exemplary embodiment of the present disclosure. FIG. 5a to FIG. 5f are cross-sectional views of respective processes provided for describing a method of manufacturing an organic light emitting display device according to an exemplary embodiment of the present disclosure.

Figure 5A:
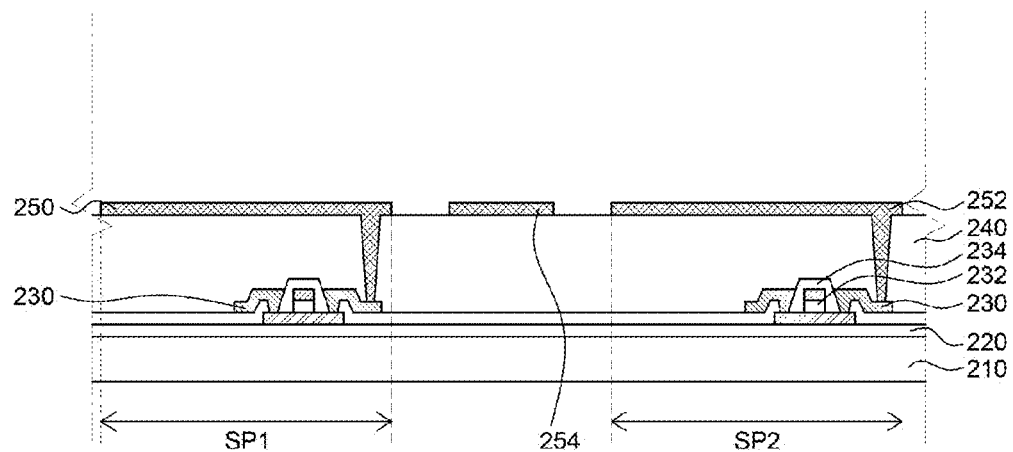
FIG. 5a to FIG. 5f are cross-sectional views of respective processes provided for describing a method of manufacturing an organic light emitting display device according to an exemplary embodiment of the present disclosure.

First, as illustrated in FIG. 5a, while the first anode 250 and the second anode 252 are formed on the substrate 210. The first auxiliary electrode 254 is formed between the first anode 250 and the second anode 252 (S410).

The first anode 250, the second anode 252, and the first auxiliary electrode 254 may be formed of the same material in the concurrent processes. Herein, a patterned mask may be used to form the first anode 250, the first auxiliary electrode 254, and the second anode 252 so as to be separated from each other.

As illustrated in FIG. 5a, before the first anode 250, the second anode 252, and the first auxiliary electrode 254 are formed, the buffer layer 220, the thin film transistor 230, the gate insulating layer 232, the interlayer insulating layer 234, and the flattening layer 240 may be further formed on the substrate 210. Also, a light-blocking metal layer may be further formed between the substrate 210 and the buffer layer 220.

Figure 5B:
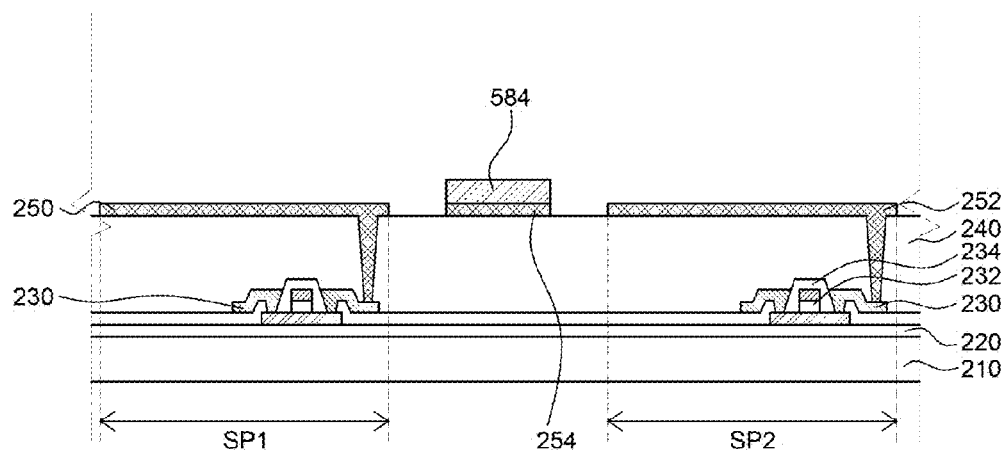

Then, as illustrated in FIG. 5b, a sacrificing layer 584 is formed on the first auxiliary electrode 254 (S420).

The sacrificing layer 584 may be etched with an etchant in a subsequent process so as to be the second auxiliary electrode 280 and the third auxiliary electrode 282. In this sense, the sacrificing layer 584 may be formed of any one of molybdenum (Mo), aluminum (Al), chromium (Cr), gold (Au), titanium (Ti), nickel (Ni), neodymium (Nd), and copper (Cu), or an alloy thereof. Further, the sacrificing layer 584 may be formed of a material different in etching selectivity from the first auxiliary electrode 254.

In order to form the sacrificing layer 584 only on the first auxiliary electrode 254, a patterned mask may be used.

Figure 5C:
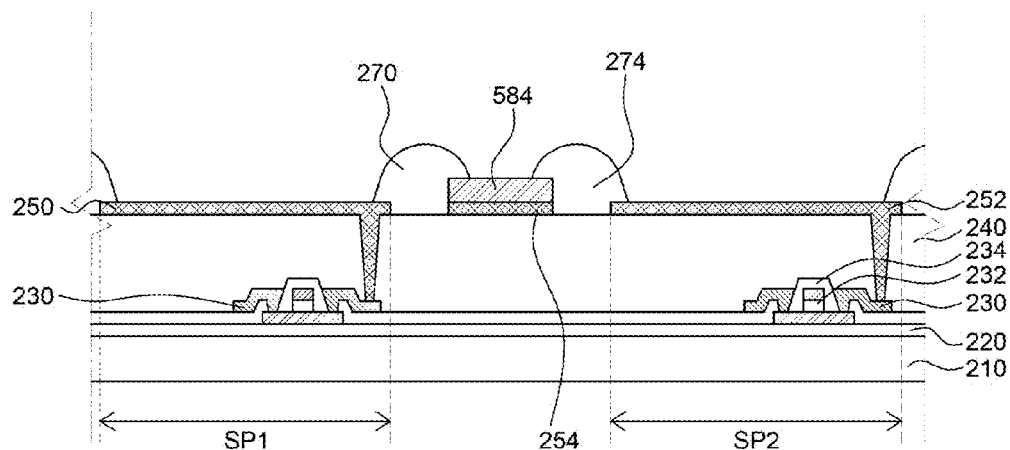

Then, as illustrated in FIG. 5c, the first bank 270 is formed to cover an edge of the first anode 250 and an edge of the sacrificing layer 584. Further, the second bank 274 is formed to cover an edge of the second anode 252 and an edge of the sacrificing layer 584 (S430).

The first bank 270 and the second bank 274 may be formed of the same material in concurrent processes. In order to form the first bank 270 and the second bank 274, a patterned mask may be used.

Figure 5D:
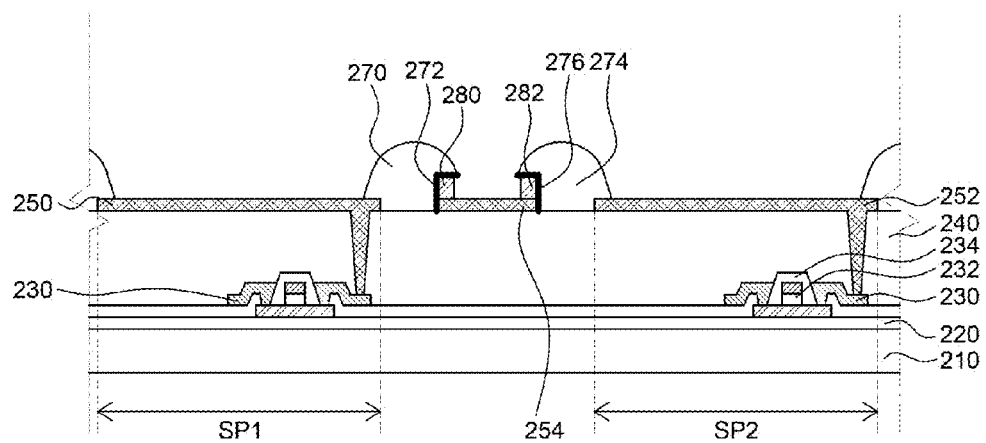

Then, as illustrated in FIG. 5d, the sacrificing layer 584 is etched with an etchant so as to form the second auxiliary electrode 280 between the first bank 270 and the first auxiliary electrode 254 and the third auxiliary electrode 282 between the second bank 274 and the first auxiliary electrode 254 (S440)

Herein, the etchant may be formed of a material having an etching selectivity at which the first auxiliary electrode 254 is not etched but only the sacrificing layer 584 can be etched. For example, the etchant may be formed of a sulfuric acid ($H_2SO_4$) aqueous solution, a nitric acid ($HNO_3$) aqueous solution, or a phosphoric acid ($H_3PO_4$) aqueous solution.

As illustrated in FIG. 5d, as the sacrificing layer 584 is etched by using the etchant, the sacrificing layer 584 is gradually etched from an exposed central portion to a non-exposed edge portion. Also, the non-etched edge portion of the sacrificing layer 584 becomes the second auxiliary electrode 280 and the third auxiliary electrode 282. Further, when the sacrificing layer 584 is etched with the etchant, as recessed portions formed along a boundary of the first bank 270 or the second bank 274, the undercut 272 of the first bank 270 and the undercut 276 of the second bank 274 including one side that is in contact with the second auxiliary electrode 280 or the third auxiliary electrode 282 and the first auxiliary electrode 254 are formed.

In S440, a width in a horizontal direction of the second auxiliary electrode 280 and a width in a horizontal direction of the third auxiliary electrode 282 can be adjusted by adjusting an etching time of the sacrificing layer 584. A contact resistance between the second auxiliary electrode 280 and the first cathode 290 and a contact resistance between the third auxiliary electrode 282 and the second cathode 292 may vary depending on the width in a horizontal direction of the second auxiliary electrode 280 and the width in a horizontal direction of the third auxiliary electrode 282. Details thereof will be described in more detail with reference to FIG. 6 and FIG. 7a to FIG. 7e.

Figure 5E:
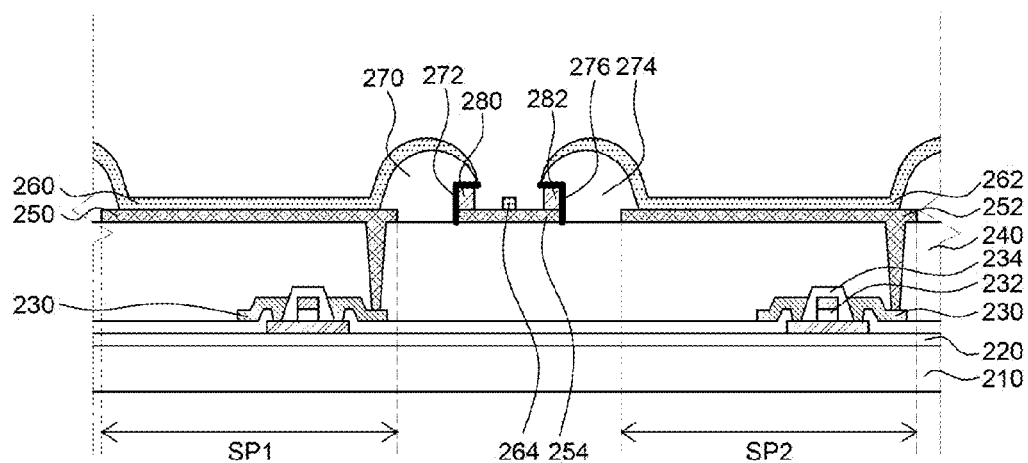

Then, as illustrated in FIG. 5e, the first organic light emitting layer 260 and the second organic light emitting layer 262 are formed on the first anode 250 and the second anode 252, respectively (S450).

Herein, the first organic light emitting layer 260 and the second organic light emitting layer 262 may be formed of the same material in concurrent processes. Further, as illustrated in FIG. 5e, while the first organic light emitting layer 260 and the second organic light emitting layer 262 are formed, the organic material layer 264 formed of the same material as the first organic light emitting layer 260 and the second organic light emitting layer 262, may be further formed on the exposed central portion of the first auxiliary electrode 254.

As illustrated in FIG. 5e, an organic material constituting the first organic light emitting layer 260 and the second organic light emitting layer 262 is just deposited on only a part of the first anode 250 and the first bank 270 and a part of the second anode 252 and the second bank 274. However, it does not reach the second auxiliary electrode 280 and the third auxiliary electrode 282 along boundaries of the first bank 270 and the second bank 274. This is because the organic material constituting the first organic light emitting layer 260 and the second organic light emitting layer 262 generally has a low step coverage.

The first organic light emitting layer 260, the second organic light emitting layer 262, and the organic material layer 264 may be formed by using a thermal deposition method. Since the thermal deposition method is a deposition method with a low step coverage, it can help the organic material constituting the first organic light emitting layer 260 and the second organic light emitting layer 262 not to reach the second auxiliary electrode 280 and the third auxiliary electrode 282.

Meanwhile, as illustrated in FIG. 5e, the thickness of the organic material layer 264 is smaller than thicknesses of the already formed second auxiliary electrode 280 and third auxiliary electrode 282. Therefore, a space between the organic material layer 264 and the first bank 270 and a space between the organic material layer 264 and the second bank 274 are opened. Further, the first cathode 290 and the second cathode 292 may be formed later so as to be brought into contact with the second auxiliary electrode 280 and third auxiliary electrode 282, respectively.

Figure 5F:
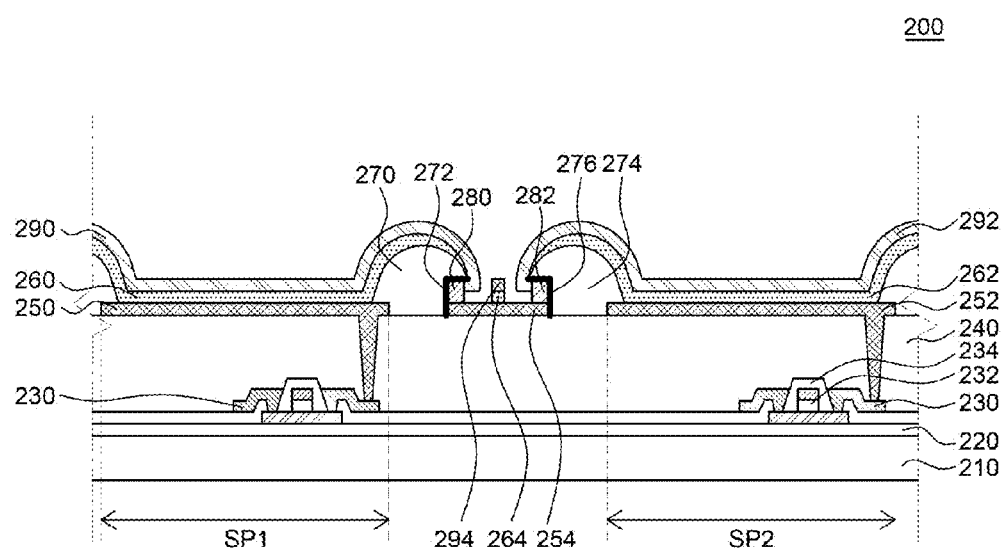

Then, as illustrated in FIG. 5f, the first cathode 290 is formed on the first organic light emitting layer 260 and the first bank 270 so as to be electrically connected with the second auxiliary electrode 280. Also, the second cathode 292 is formed on the second organic light emitting layer 262 and the second bank 274 so as to be electrically connected with the third auxiliary electrode 282 (S460).

Herein, the first cathode 290 and the second cathode 292 may be formed of the same material in concurrent processes. Further, as illustrated in FIG. 5f, while the first cathode 290 and the second cathode 292 are formed, the conductor layer 294 formed of the same material as the first cathode 290 and the second cathode 292 may be further formed on the organic material layer 264.

The first cathode 290 and the second cathode 292 are formed of a material, such as a transparent conductive material, having a higher step coverage than the organic material constituting the first organic light emitting layer 260 and the second organic light emitting layer 262. Accordingly, the first cathode 290 may be formed to be in contact with the second auxiliary electrode 280 and the second cathode 292 may be formed to be in contact with the third auxiliary electrode 282.

The first cathode 290, the second cathode 292, and the conductor layer 294 may be formed by using a sputtering method. Since the sputtering method is a deposition method with a relatively high step coverage, it can help the first cathode 290 to be formed so as to be in contact with the second auxiliary electrode 280. Also, it can help the second cathode 292 to be formed so as to be in contact with the third auxiliary electrode 282.

In S460, while the first cathode 290 and the second cathode 292 are formed of the same material in concurrent processes, as illustrated in FIG. 5f, a deposition time of the first cathode 290 and the second cathode 292 may be adjusted such that the first cathode 290 and the second cathode 292 are formed to be separated from each other.

In the method of manufacturing the organic light emitting display device 200 according to an exemplary embodiment of the present disclosure, it is possible to readily form the second auxiliary electrode 280 and the third auxiliary electrode 282 by a simple process in which the sacrificing layer 584 is formed on the first auxiliary electrode 254, the first bank 270 and the second bank 274 are formed, and then, the sacrificing layer 584 is etched.

Figure 6:
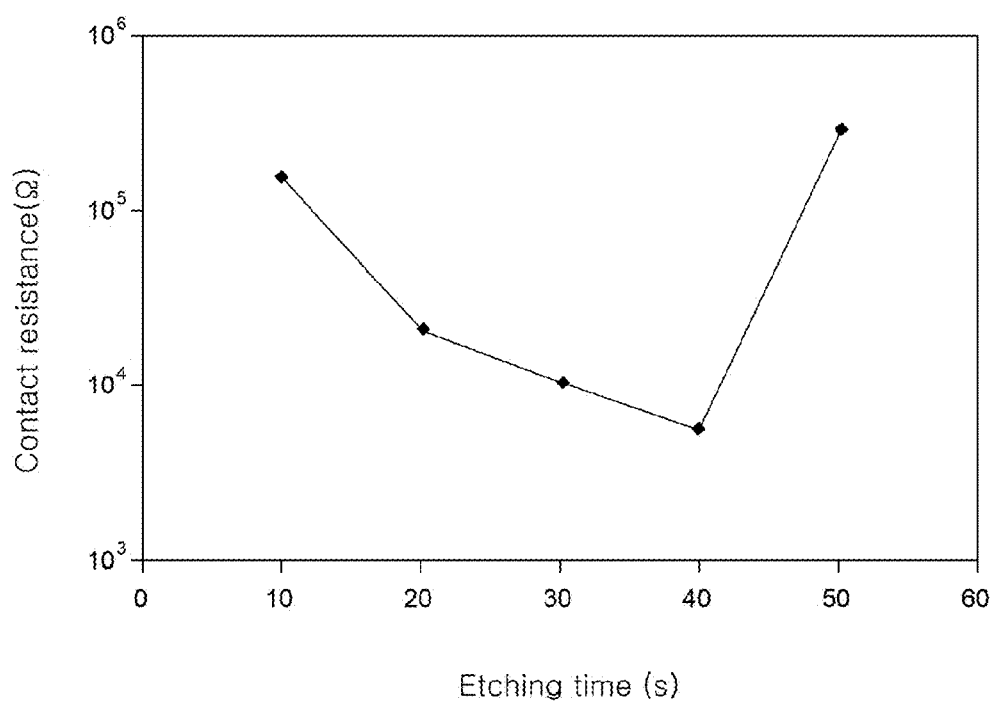
FIG. 6 is a graph illustrating a change in contact resistance between a first cathode and a second auxiliary electrode when adjusting an etching time of a sacrificing layer in the present disclosure.

FIG. 6 is a graph illustrating a change in contact resistance between a first cathode and a second auxiliary electrode when adjusting an etching time of a sacrificing layer in the present disclosure. FIG. 7a to FIG. 7e are photos illustrating a contact level between a first cathode and a second auxiliary electrode when adjusting an etching time of a sacrificing layer in the present disclosure.

In order to produce the results as illustrated in FIG. 6 and FIG. 7a to FIG. 7e, an indium tin oxide (ITO) of 620 Å is used as a first cathode, polyimide of 2832 Å is used as a first bank, and a laminated structure of molybdenum alloy (MoTi) of 450 Å and copper (Cu) of 3000 Å is used as a sacrificing layer.

Figure 7A:
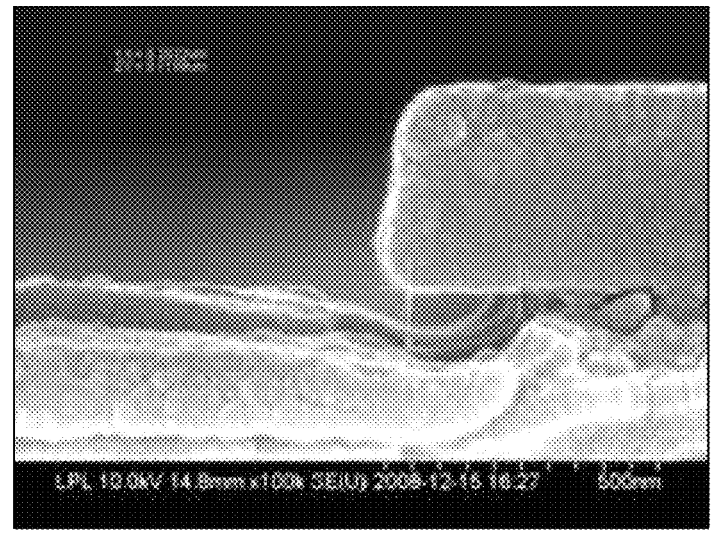
FIG. 7a to FIG. 7e are photos illustrating a contact level between a first cathode and a second auxiliary electrode when adjusting an etching time of a sacrificing layer in the present disclosure.
Figure 7B:
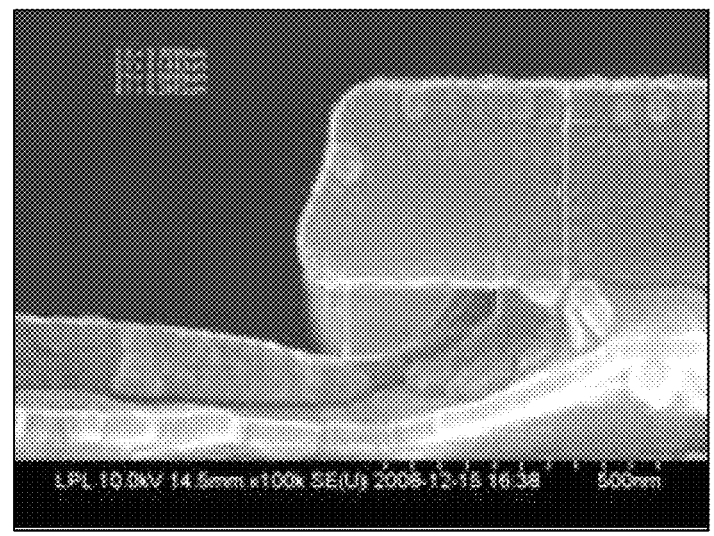
Figure 7C:
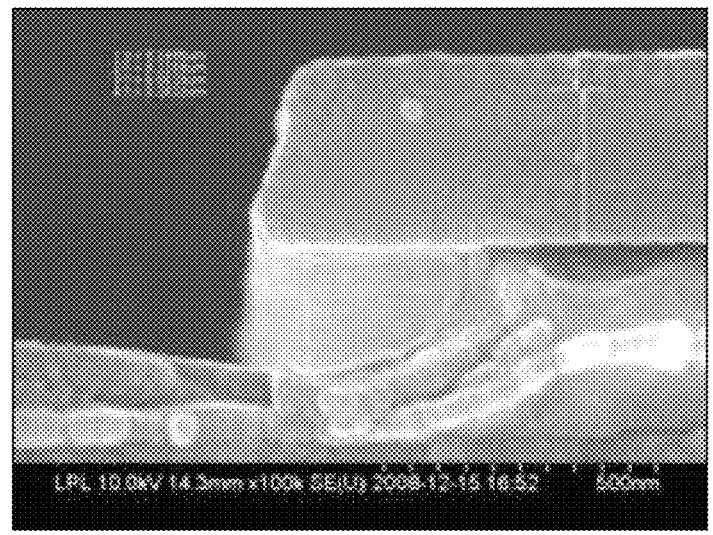
Figure 7D:
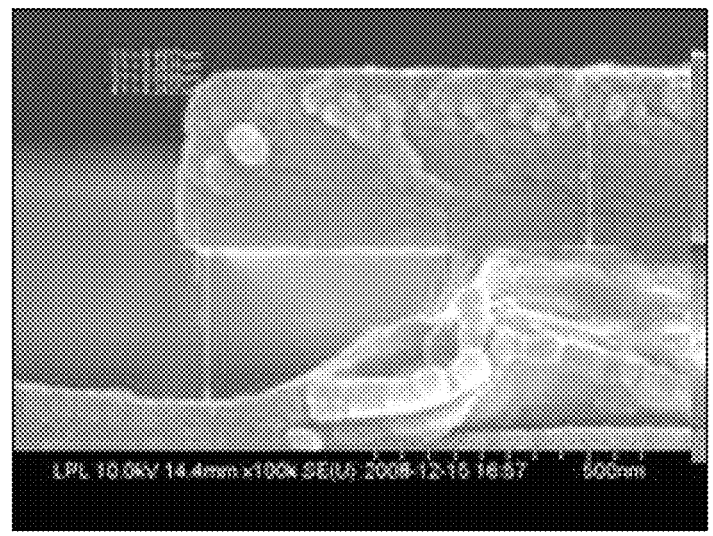
Figure 7E:
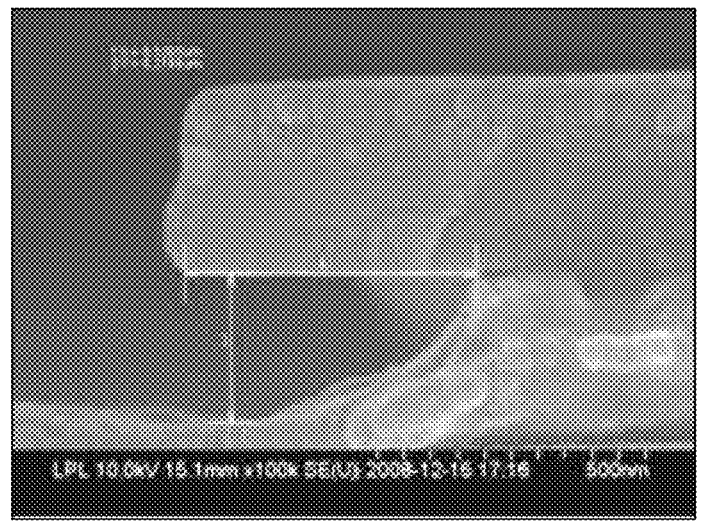

FIG. 7a is a photo obtained when an etching time is adjusted to 10 seconds. FIG. 7b is a photo obtained when an etching time is adjusted to 20 seconds. FIG. 7c is a photo obtained when an etching time is adjusted to 30 seconds. FIG. 7d is a photo obtained when an etching time is adjusted to 40 seconds, and FIG. 7e is a photo obtained when an etching time is adjusted to 50 seconds.

Referring to FIG. 6 and FIG. 7a to FIG. 7e, it can be seen that in a structure in which a first cathode, a first bank, and a sacrificing layer have the above-described values, as the etching time increases from 10 seconds to 40 seconds, a contact resistance gradually decreases. Further, when the etching time reaches 50 seconds, the contact resistance increases. It is assumed that the above-described result is produced for the reason that as the etching time increases from 10 seconds to 40 seconds, a width in a horizontal direction of the second auxiliary electrode decreases. Thus, it is easy for a source material of the first cathode to be brought into contact with the second auxiliary electrode. However, if the etching time increases to 50 seconds and the width in a horizontal direction of the second auxiliary electrode excessively decreases, it is difficult for the source material of the first cathode to enter a space between the first bank and the first auxiliary electrode. It can be seen from the above-described result that when an etching time is appropriately adjusted, a minimum contact resistance between the first cathode and the second auxiliary electrode can be achieved.

Figure 8:
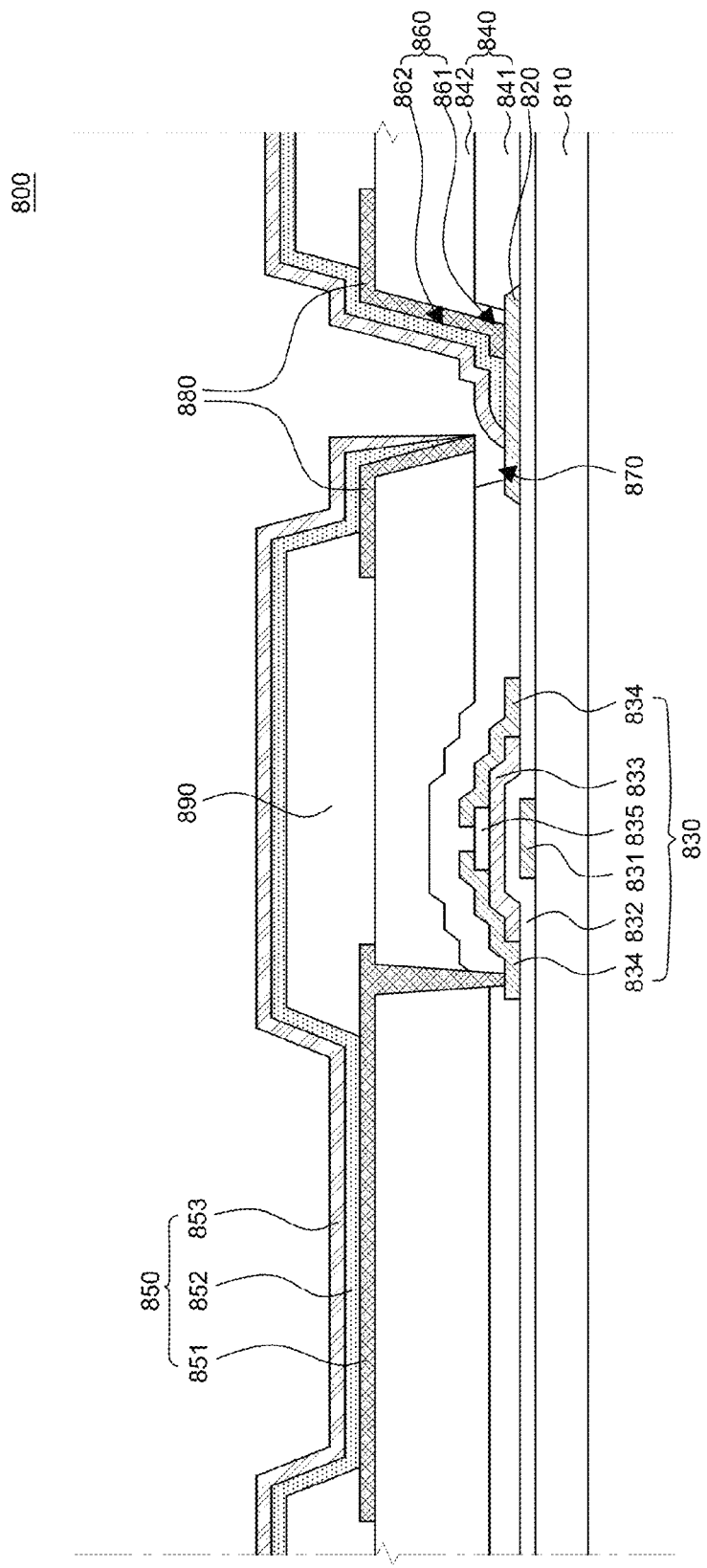
FIG. 8 is a schematic cross-sectional view of an organic light emitting display device capable of maintaining a uniform current in an organic light emitting element by connecting a cathode of the organic light emitting element with a fourth auxiliary electrode through a flattening layer. A flattening layer includes a contact hole according to an exemplary embodiment of the present disclosure.

FIG. 8 is a schematic cross-sectional view of an organic light emitting display device capable of maintaining a uniform current in an organic light emitting element by connecting a cathode of the organic light emitting element with a fourth auxiliary electrode through a flattening layer including a contact hole according to an exemplary embodiment of the present disclosure.

Referring to FIG. 8, an organic light emitting display device 800 includes a thin film transistor 830 and a fourth auxiliary electrode 820 disposed on a substrate 810. Herein, the substrate 810 may be a glass substrate or a substrate formed of a polyimide-based flexible material. Although not illustrated in FIG. 8, the organic light emitting display device 800 may further include a barrier layer disposed on the substrate 810 in order to minimize infiltration of water and oxygen.

Although FIG. 8 illustrates that the thin film transistor 830 has an inverted staggered structure, a thin film transistor having a coplanar structure may also be used.

The thin film transistor 830 includes a gate electrode 831. Also, an insulating film 832 for insulating the gate electrode 831 is disposed on the gate electrode 831, and an active layer 833 is disposed on the insulating film 832. Source/drain electrodes 834 are disposed on the active layer 833, and an ESL (Etch Stopper Layer) 835 is disposed between the source/drain electrodes 834.

A passivation film 841 configured to protect the thin film transistor 830 during a subsequent process after formation of the thin film transistor 830 is disposed on the thin film transistor 830, and a flattening film 842 is disposed on the passivation film 841. Further, an organic light emitting element 850 is disposed on the flattening film 842. Herein, a flattening layer 840 includes the passivation film 841 and the flattening film 842.

The organic light emitting element 850 includes an anode 851, an organic light emitting layer 852, and a cathode 853 disposed on the flattening film 842. Also, the anode 851 is electrically connected with the thin film transistor 830.

The organic light emitting layer 852 is configured to emit light by an electron and a hole injected from the anode 851 and the cathode 853. It may include a hole injection layer, a hole transporting layer, an electron transporting layer, and an electron injection layer for smooth formation of exciton, and may be an organic light emitting layer having a multi-layer structure. One of the anode 851 and the cathode 853 may be a transparent electrode that transmits light emitted from the organic light emitting layer 852, and the other one may be a reflective electrode that induces emission of light in one direction.

A bank 890 is disposed on the periphery of the anode 851 so as to separate a pixel.

The fourth auxiliary electrode 820 may be formed of the same material as an electrode selected from the gate electrode 831 or the source/drain electrodes 834 constituting the thin film transistor 820. The fourth auxiliary electrode 820 is electrically connected with the cathode 853 through a contact hole 860 in the flattening layer 840 such that the cathode 853 has a uniform electrical resistance within the organic light emitting display device.

The contact hole 860 for exposing the fourth auxiliary electrode 820 is disposed in the flattening layer 840. The flattening layer 840 may have a multi-layer structure including the passivation film 841 and the flattening film 842, and may be configured in various ways depending on a design of a person having ordinary skill in the art.

The passivation film 841 and the flattening film 842 included in the flattening layer 840 may be formed of materials different from each other in etching rate. That is, the passivation film 841 and the flattening film 842 may be formed of materials different from each other in etching rate with respect to the same etching solvent. Otherwise, the passivation film 841 and the flattening film 842 may be formed of materials each having reactivity with a different etching solvent. That is, the flattening film 842 may not react with an etching solvent with which the passivation film 841 reacts, and the passivation film 841 may not react with an etching solvent with which the flattening film 842 reacts.

The contact hole 860 includes a first contact hole 861 and a second contact hole 862. The first contact hole 861 is disposed in the passivation film 841 and the second contact hole 862 is disposed in the flattening film 842. The first contact hole 861 may be disposed more widely than the second contact hole 862. To be specific, one side of the first contact hole 861 may be positioned on an inner side than one side of the second contact hole 862, so that the one side of the first contact hole 861 may be disposed under the flattening film 842. Further, the contact hole 860 may have an inclination of less than 89 degrees from the substrate 810 such that the cathode 853 can be disposed as being extended to an undercut 870.

As described above, the second contact hole 862 is disposed more widely than the first contact hole 861 so as to form the undercut 870. Also, the contact hole 860 including the undercut 870 exposes the fourth auxiliary electrode 820. The organic light emitting layer 852 has a discontinuous section at the undercut 870.

The cathode 853 may be formed of a material having a relatively high step coverage than a material of the organic light emitting layer 852. Thus, the organic light emitting layer 852 has a discontinuous section at the undercut 870, and the cathode 853 is electrically connected with the fourth auxiliary electrode 820.

Meanwhile, if the flattening film 842 included in the flattening layer 840 is exposed through the second contact hole 862, oxygen, hydrogen, or water included in the flattening film 842 may infiltrate into the organic light emitting layer 852 from an inner surface of the second contact hole 862 as time passes. Therefore, an outgas reducing layer 880 is disposed on an inner surface of the contact hole 860 so as to minimize outgassing.

The outgas reducing layer 880 is disposed to cover the inner surface of the contact hole 860 and also partially cover one side of the contact hole 860 such that the undercut 870 disposed at the contact hole 860 can be exposed. That is, the outgas reducing layer 880 is disposed to cover an inner surface of the contact hole 860 where the undercut 870 is disposed and cover the inner surface of the second contact hole 862. The outgas reducing layer 880 also covers the first contact hole 861 on an inner surface of the contact hole 860 where the undercut 870 is not disposed. In this case, the outgas reducing layer 880 may be disposed to cover an upper end of the contact hole 860 in order to further minimize a gas which can be generated from the flattening film 842.

FIG. 9a to FIG. 9f are schematic cross-sectional views provided for describing a method of manufacturing an organic light emitting display device capable of maintaining uniform luminance by connecting a cathode of an organic light emitting element with a fourth auxiliary electrode according to an exemplary embodiment of the present disclosure. An organic light emitting display device 900 illustrated in FIG. 9a to FIG. 9f is substantially the same as the organic light emitting display device 800 illustrated in FIG. 8 except only a configuration provided to describe a method of manufacturing the organic light emitting display device. Therefore, redundant explanation thereof will be omitted.

Referring to FIG. 9a, a thin film transistor 930 is formed on a substrate 910. A gate electrode 931 is formed on the substrate 910, an insulating film 932 is formed on the gate electrode 931. An active layer 933 as a semiconductor layer is formed on the insulating film 932. Source/drain electrodes 934 are formed on the active layer 933, and an ESL (Etch Stopper Layer) 935 is formed to separate the source/drain electrodes 934, so that the thin film transistor 930 is formed.

Meanwhile, when a fourth auxiliary electrode 920 is formed on the substrate 910, the fourth auxiliary electrode 920 may be formed of the same material as the gate electrode 931 or the source/drain electrodes 934 constituting the thin film transistor 930 at the same time.

Referring to FIG. 9b, a passivation film 941 is formed to protect the thin film transistor 930. In this case, a first contact hole 961 is formed in the passivation film 941 so as to expose the fourth auxiliary electrode 920 by the passivation film 941. When the first contact hole 961 is formed in the passivation film 941, the first contact hole 961 may be formed by using a dry or wet etching process or a plasma etching process.

Figure 9C:
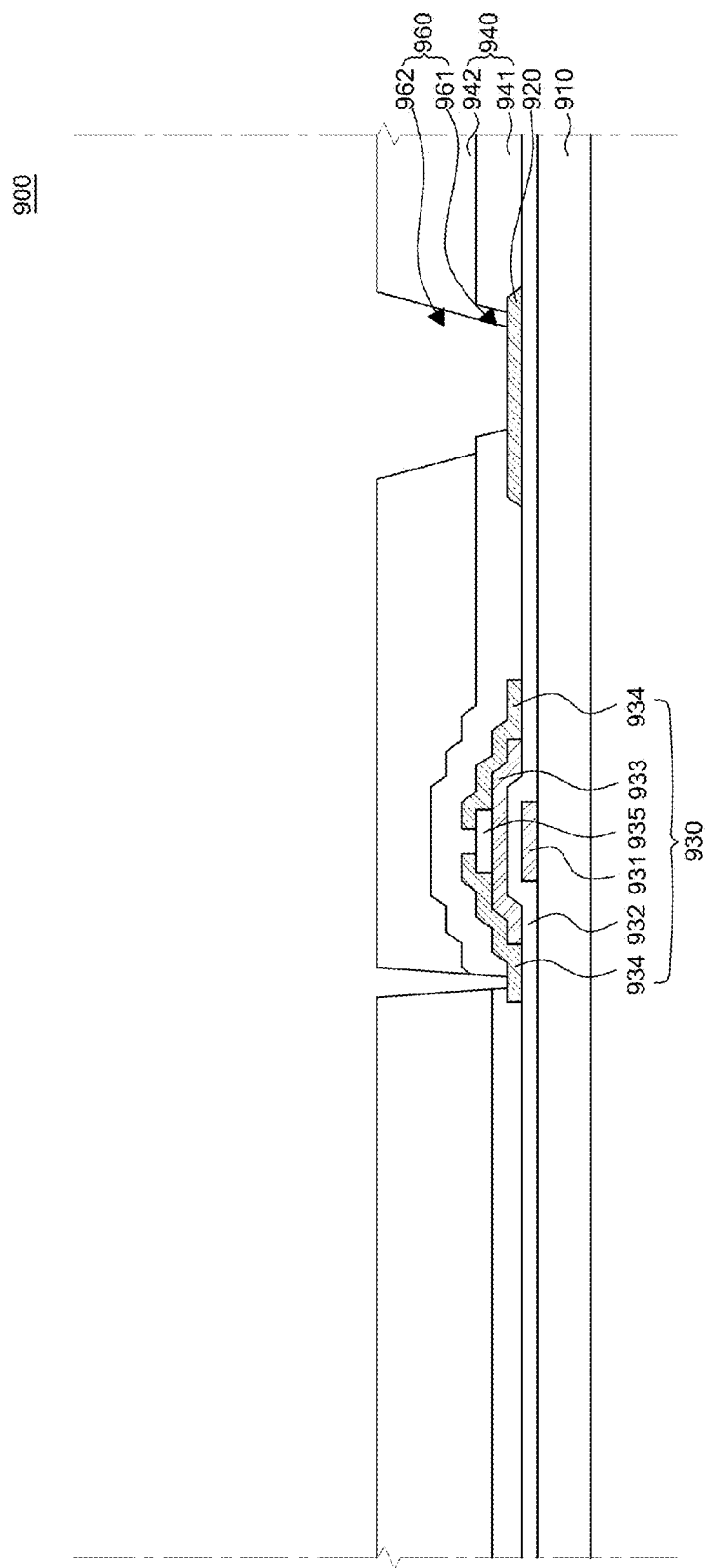

Referring to FIG. 9c, a flattening film 942 including a second contact hole 962 is formed on the passivation film 941, so that a flattening layer 940 is formed.

The flattening film 942 may be a single layer or may include a plurality of layers. Also, it may be formed by selecting a material which is different in etching rate from the passivation film 941 or reactive and etched with a solvent different from a solvent for the passivation film 941.

Then, the second contact hole 962 is formed to be overlapped with the first contact hole 961. The second contact hole 962 is formed such that the fourth auxiliary electrode 920 is exposed, the second contact hole 962 is wider than one side of the first contact hole 961, and a part of the passivation film 941 is exposed.

The contact hole 960 including the first contact hole 961 and the second contact hole 962 may be formed such that one side of the contact hole 960 has an inclination of less than 89 degrees from the substrate 910. Details thereof will be descried later.

Figure 9D:
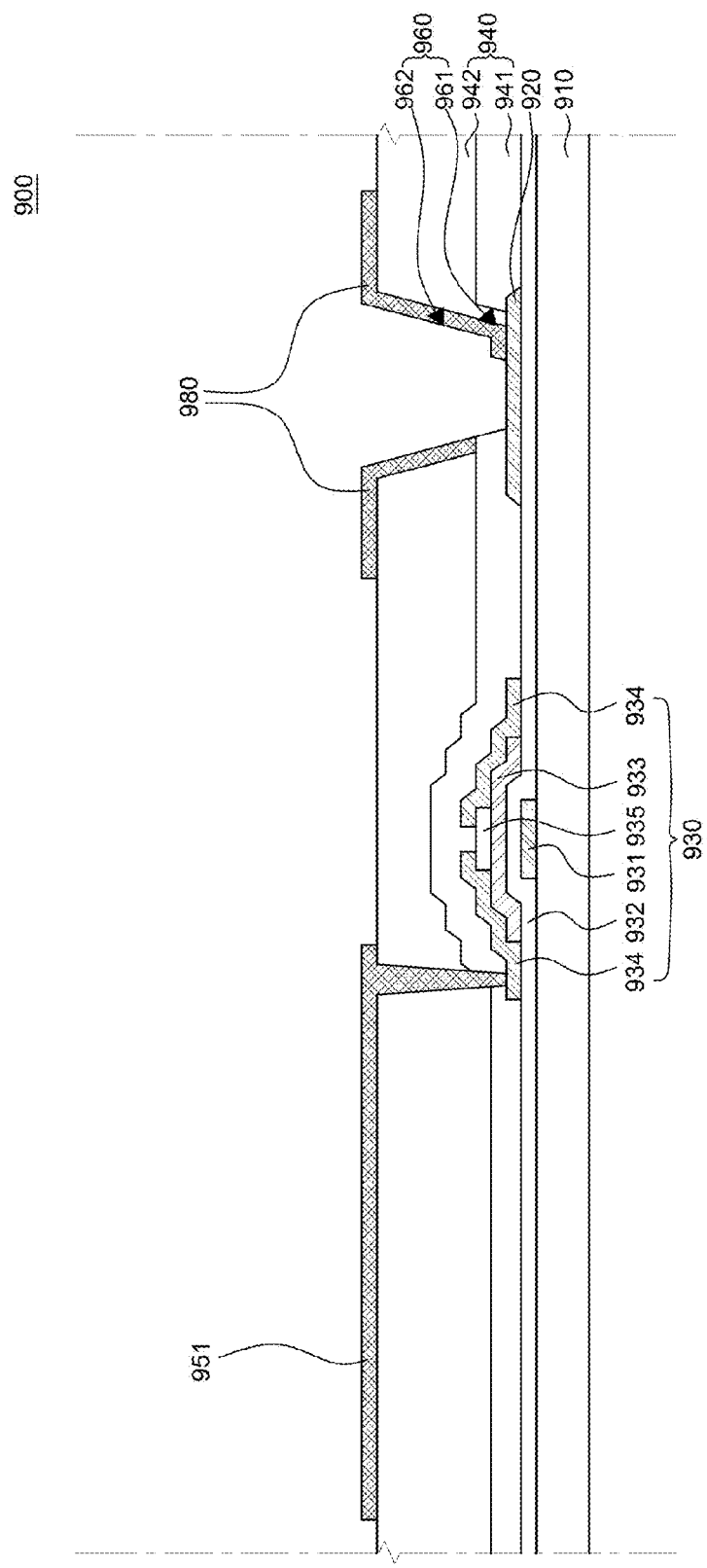

Referring to FIG. 9d, an anode 951 and an outgas reducing layer 980 are formed on the flattening film 942.

The anode 951 may be a metal electrode formed of a material reflecting light, and the outgas reducing layer 980 may be formed of the same material as the anode 951.

The outgas reducing layer 980 is disposed to cover an inner surface of the contact hole 960 but is not disposed to cover the passivation film 941 exposed through the second contact hole 962.

Figure 9E:
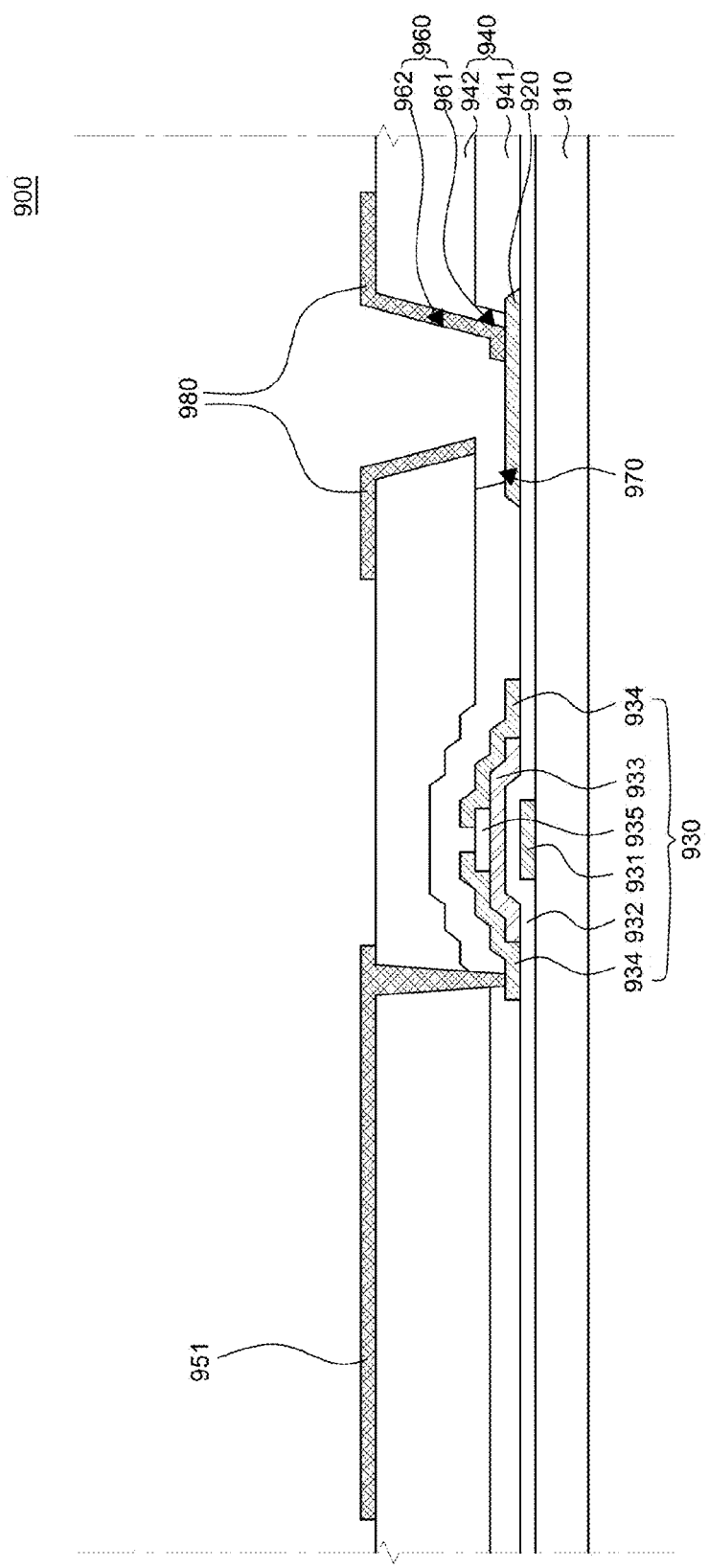

Referring to FIG. 9e, an undercut 970 is formed by performing a dry or wet etching process to the passivation film 941 exposed through the second contact hole 962.

Figure 9F:
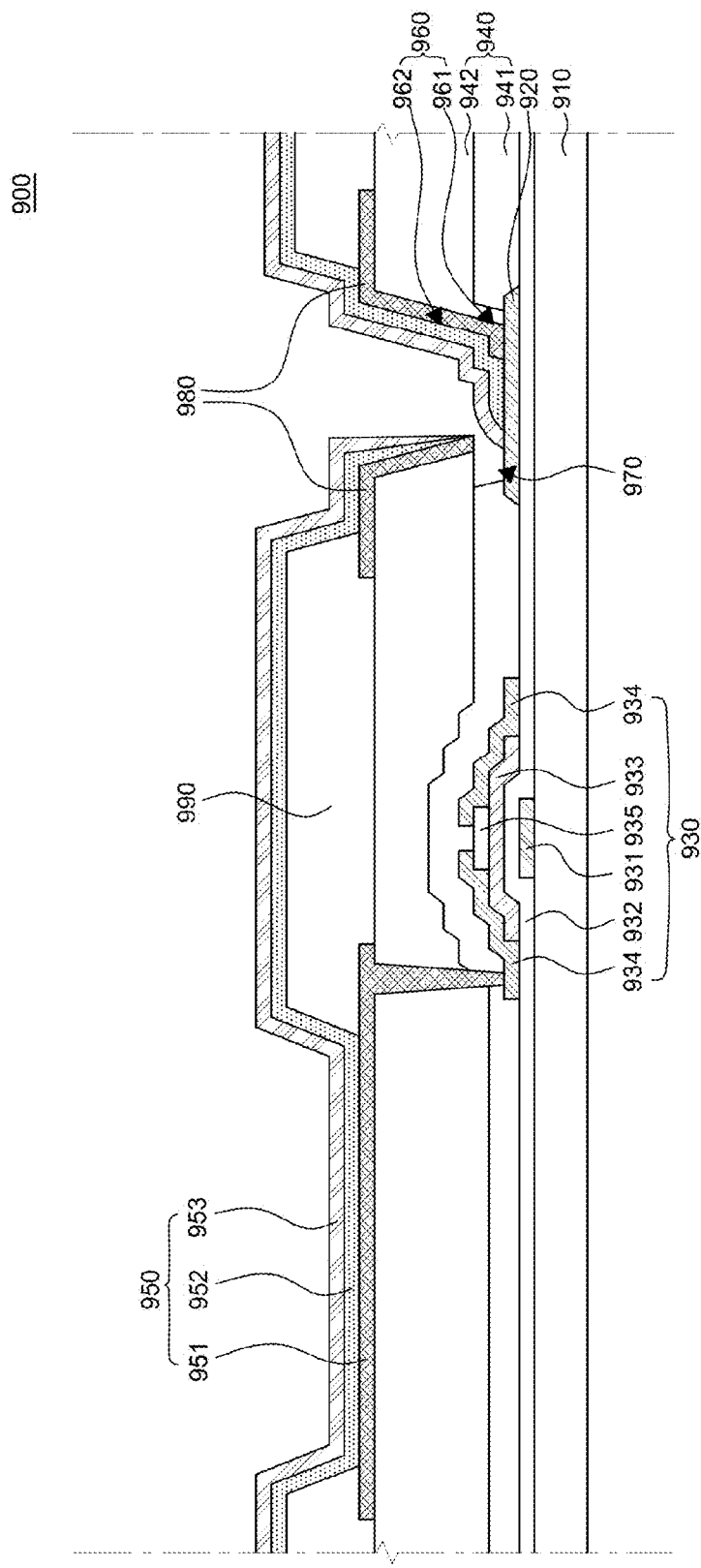

Then, an organic light emitting layer 952 and a cathode 953 are formed illustrated in FIG. 9f. The organic light emitting layer 952 cannot be formed to an inner side of the undercut 970. Also, the cathode 953 has a higher step coverage than the organic light emitting layer 952 so as to be connected with the fourth auxiliary electrode 920 exposed at the inner side of the undercut 970.

Apart of the inner surface of the contact hole 960 may have an inclination of less than 89 degrees from the substrate 910 such that the cathode 953 can be smoothly connected with the fourth auxiliary electrode 920 within the undercut 970.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. An organic light emitting display device comprising:
   a substrate;
   a first anode and a second anode formed on the substrate;
   a first auxiliary electrode formed between the first anode and the second anode;
   a first organic light emitting layer and a second organic light emitting layer respectively formed on the first anode and the second anode;
   a first bank formed to cover an edge of the first anode and including an undercut formed on an upper part of a first edge of the first auxiliary electrode;
   a second bank formed to cover an edge of the second anode and including an undercut formed on an upper part of a second edge of the first auxiliary electrode;
   a second auxiliary electrode disposed between the undercut of the first bank and the first auxiliary electrode;
   a third auxiliary electrode disposed between the undercut of the second bank and the first auxiliary electrode;
   a first cathode formed on the first organic light emitting layer and the first bank and electrically connected with the second auxiliary electrode; and
   a second cathode formed on the second organic light emitting layer and the second bank and electrically connected with the third auxiliary electrode.

2. The organic light emitting display device according to claim 1, wherein the first anode, the second anode, and the first auxiliary electrode are formed of the same material.

3. The organic light emitting display device according to claim 1, wherein the undercut of the first bank includes one side that is in contact with the first auxiliary electrode and the second auxiliary electrode, and the undercut of the second bank include one side that is in contact with the first auxiliary electrode and the third auxiliary electrode.

4. The organic light emitting display device according to claim 1, wherein the second auxiliary electrode and the third auxiliary electrode are formed of the same material.

5. The organic light emitting display device according to claim 4, wherein the second auxiliary electrode and the third auxiliary electrode are formed of a material different in etching selectivity from the first auxiliary electrode.

6. The organic light emitting display device according to claim 1, wherein each of the second auxiliary electrode and the third auxiliary electrode is formed by laminating different kinds of metals.

7. The organic light emitting display device according to claim 1, wherein the second auxiliary electrode is completely overlapped with the first bank, and the third auxiliary electrode is completely overlapped with the second bank.

8. The organic light emitting display device according to claim 1, wherein each of the first cathode and the second cathode includes a transparent conductive material.

9. The organic light emitting display device according to claim 1, wherein each of the first cathode and the second cathode is in contact with the first auxiliary electrode.

10. The organic light emitting display device according to claim 1, further comprising:
a light-blocking metal layer formed on the substrate and electrically connected with the first auxiliary electrode; and
a thin film transistor formed on the light-blocking metal layer and including an active layer formed of an oxide semiconductor.

11. An organic light emitting display device comprising:
a substrate;
a thin film transistor disposed on the substrate;
a fourth auxiliary electrode formed of the same material as at least one of electrodes constituting the thin film transistor;
a flattening layer formed to cover the thin film transistor and the fourth auxiliary electrode; and
an organic light emitting element including an anode disposed on the flattening layer, an organic light emitting layer, and a cathode, the cathode electrically connected with the fourth auxiliary electrode through a contact hole in the flattening layer so as to have a uniform electrical resistance,
wherein the contact hole includes:
an undercut configured to electrically connect the cathode with the fourth auxiliary electrode; and
an outgas reducing layer capable of minimizing a gas generated from the flattening layer.

12. The organic light emitting display device according to claim 11, wherein the flattening layer is formed of at least two layers which are respectively reactive with different etching solvents or different from each other in etching rate.

13. The organic light emitting display device according to claim 12, wherein the flattening layer further includes a passivation film and a flattening film configured to protect the thin film transistor, and the contact hole is disposed in the passivation film and the flattening film.

14. The organic light emitting display device according to claim 13, wherein the contact hole includes a first contact hole disposed in the passivation film and a second contact hole disposed in the flattening film, and
the first contact hole and the second contact hole are partially overlapped with each other so as to expose the fourth auxiliary electrode and form the undercut.

15. The organic light emitting display device according to claim 11, wherein the outgas reducing layer is formed of the same material as the anode.

16. The organic light emitting display device according to claim 15, wherein the outgas reducing layer is disposed to cover an inner surface of the contact hole.

17. A method of manufacturing an organic light emitting display device, comprising:
forming a first auxiliary electrode between a first anode and a second anode while forming the first anode and the second anode on a substrate;
forming a sacrificing layer on the first auxiliary electrode;
forming a first bank to cover an edge of the first anode and an edge of the sacrificing layer and a second bank to cover an edge of the second anode and an edge of the sacrificing layer;
forming a second auxiliary electrode between the first bank and the first auxiliary electrode and a third auxiliary electrode between the second bank and the first auxiliary electrode by etching the sacrificing layer with an etchant;
forming a first organic light emitting layer and a second organic light emitting layer respectively on the first anode and the second anode; and
forming a first cathode on the first organic light emitting layer and the first bank so as to be electrically connected with the second auxiliary electrode and a second cathode on the second organic light emitting layer and the second bank so as to be electrically connected with the third auxiliary electrode.

18. The method of manufacturing an organic light emitting display device according to claim 17, wherein the sacrificing layer is formed of a material different in etching selectivity from the first auxiliary electrode.

19. The method of manufacturing an organic light emitting display device according to claim 17, wherein forming the second auxiliary electrode and the third auxiliary electrode includes adjusting a width in a horizontal direction of each of the second auxiliary electrode and the third auxiliary electrode by adjusting an etching time of the sacrificing layer.

20. A method of manufacturing an organic light emitting display device, comprising:
forming a thin film transistor and a fourth auxiliary electrode on a substrate;
forming a thin film transistor passivation film on the thin film transistor and the fourth auxiliary electrode;
exposing the fourth auxiliary electrode by forming a first contact hole in the thin film transistor passivation film;
forming a flattening film on the thin film transistor passivation film;
exposing a part of the fourth auxiliary electrode and the thin film transistor passivation film by forming a second contact hole in the flattening film;
forming a first anode connected with the thin film transistor on the flattening film;
forming an outgas reducing layer on the second contact hole;
etching the thin film transistor passivation film exposed through the second contact hole;
forming a first organic light emitting layer on the first anode; and
forming a first cathode on the first organic light emitting layer.

* * * * *